(12) United States Patent
Yang

(10) Patent No.: US 9,640,268 B2
(45) Date of Patent: May 2, 2017

(54) NONVOLATILE MEMORY DEVICE INCLUDING MEMORY AREA STORING INFORMATION USED FOR SEARCHING ERASED PAGE, DATA STORAGE DEVICE INCLUDING THE SAME, AND OPERATING METHOD THEREOF

(71) Applicant: SK hynix Inc., Gyeonggi-do (KR)

(72) Inventor: Chan Woo Yang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/983,350

(22) Filed: Dec. 29, 2015

(65) Prior Publication Data

US 2017/0062057 A1 Mar. 2, 2017

(30) Foreign Application Priority Data

Aug. 28, 2015 (KR) .......................... 10-2015-0122057

(51) Int. Cl.
*G11C 16/04* (2006.01)
*G11C 16/14* (2006.01)
*G11C 11/56* (2006.01)
*G11C 16/26* (2006.01)
*G11C 16/34* (2006.01)

(52) U.S. Cl.
CPC .............. *G11C 16/14* (2013.01); *G11C 11/56* (2013.01); *G11C 16/26* (2013.01); *G11C 16/3459* (2013.01); *G11C 11/5628* (2013.01)

(58) Field of Classification Search
USPC ............. 365/185.03, 185.02, 185.24, 185.29
IPC ....................... G11C 11/5628,11/5642, 11/5621
See application file for complete search history.

(56) References Cited

U.S. PATENT DOCUMENTS

| | | | | |
|---|---|---|---|---|
| 6,683,811 B2* | 1/2004 | Ishii | .................... | G11C 16/0491 365/185.02 |
| 7,353,324 B2* | 4/2008 | Tanaka | .................. | G06F 3/0611 711/103 |
| 2010/0034019 A1* | 2/2010 | Kang | .................. | G11C 11/5628 365/185.03 |
| 2013/0033928 A1* | 2/2013 | Kawahara | ............... | G11C 11/16 365/158 |
| 2016/0104536 A1* | 4/2016 | Zhou | ...................... | G11C 16/10 365/185.29 |

FOREIGN PATENT DOCUMENTS

KR 100704618 4/2007

* cited by examiner

*Primary Examiner* — Connie Yoha
(74) *Attorney, Agent, or Firm* — IP & T Group LLP

(57) ABSTRACT

A data storage device includes a nonvolatile memory device including: memory cells of a first area grouped by page, and memory cells of a second area respectively corresponding to pages, and suitable for storing information representing whether each page of the first area is in an erased state; and a controller suitable for providing the nonvolatile memory device with a search command for searching an erased page and a search address of a page, wherein the nonvolatile memory device provides the controller with a state of at least one memory cell of the second area corresponding to the search address in response to the search command.

13 Claims, 18 Drawing Sheets

NONVOLATILE MEMORY DEVICE INCLUDING MEMORY AREA STORING INFORMATION USED FOR SEARCHING ERASED PAGE, DATA STORAGE DEVICE INCLUDING THE SAME, AND OPERATING METHOD THEREOF

CROSS-REFERENCE TO RELATED APPLICATIONS

The present application claims priority under 35 U.S.C. §119(a) to Korean application number 10-2015-0122057, filed on Aug. 28, 2015, in the Korean Intellectual Property Office, which is incorporated herein by reference in its entirety.

BACKGROUND

1. Technical Field

Various embodiments relate to a data storage device including a nonvolatile memory device, and, more particularly, to a data storage device capable of quickly searching an erased page of a nonvolatile memory device.

2. Related Art

Recently, the computing environment paradigm has converted to ubiquitous computing so that computer systems can be used anytime and anywhere. Due to this fact, the use of portable electronic devices such as mobile phones, digital cameras, and notebook computers has rapidly increased. In general, such portable electronic devices use a data storage device having a memory device. The data storage device is used as a main memory device or an auxiliary memory device of the portable electronic devices.

A data storage device using a memory device provides advantages of excellent: stability and durability, fast information access, and low power consumption because it has no moving parts. Data storage devices having such advantages include a universal serial bus (USB) memory device, a memory card having various interfaces, a universal flash storage (UFS) device, and a solid state drive (SSD).

As portable electronic devices play a large file such as a music file or a video file, the data storage device, as a storage medium, is required to have a large storage capacity. The data storage device uses a memory device having a high integration degree for memory cells to secure a large storage capacity (e.g., a flash memory device, which is one of nonvolatile memory devices).

SUMMARY

Various embodiments are directed to a data storage device capable of quickly searching an erased page of a nonvolatile memory device.

In an embodiment a data storage device may include a nonvolatile memory device including: memory cells of a first area grouped by page, and memory cells of a second area respectively corresponding to pages, and suitable for storing information representing whether each page of the first area is in an erased state; and a controller suitable for providing the nonvolatile memory device with a search command for searching an erased page and a search address of a page, wherein the nonvolatile memory device provides the controller with a state of at least one memory cell of the second area corresponding to the search address in response to the search command.

In an embodiment, a method for operating a data storage device including a nonvolatile memory device including: memory cells of a first area; and memory cells of a second area respectively corresponding to the memory cells of the first area, and each of which stores information representing whether a program voltage is applied to a corresponding memory cell of the first area, may include performing a program operation, when a program command and a program address of a first memory cell of the first area are provided, to a first memory cell of the second area corresponding to the program address; and performing a program operation to the first memory cell of the first area.

In an embodiment, a nonvolatile memory device may include a memory cell of a first area suitable for storing data; and a memory cell of a second area suitable for storing information representing whether a program voltage is applied to the memory cell of the first area.

According to the embodiments, it is possible to quickly search an erased page of a nonvolatile memory device.

DETAILED DESCRIPTION

Figure 1:
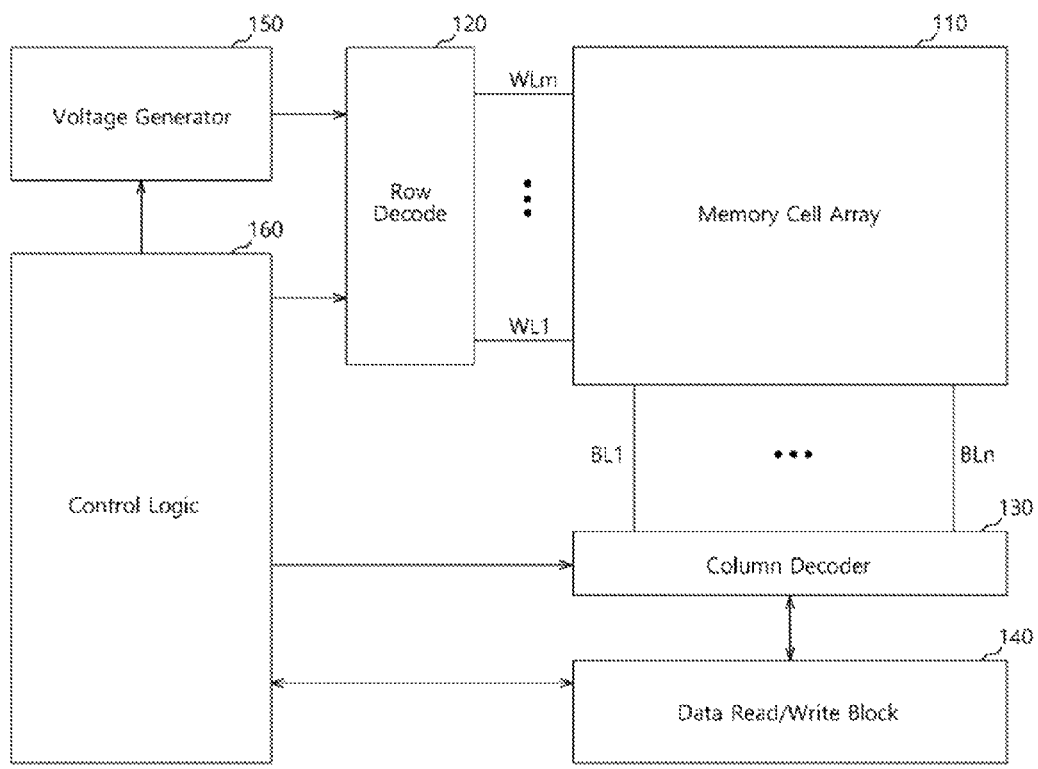
FIG. 1 is a block diagram illustrating a nonvolatile memory device in accordance with an embodiment.

In the present invention, advantages, features and methods for achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being on "connected to" or "coupled to" another element, it may be directly "on," connected or coupled to the other element or intervening elements may be present. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

Hereinafter, a nonvolatile memory device, a data storage device including the same, and an operating method thereof will be described below with reference to the accompanying drawings through various examples of embodiments.

FIG. 1 is a block diagram illustrating a nonvolatile memory device 100 in accordance with an embodiment. Referring to FIG. 1, the nonvolatile memory device 100 may include a memory cell array 110, a row decoder 120, a column decoder 130, a data read/write block 140, a voltage generator 150, and a control logic 160.

The memory cell array 110 may include memory cells arranged at cross-points between word lines WL1 to WLm and bit lines BL1 to BLn. The memory cells may be grouped by an access unit. For example, a memory block may be grouped as an erase unit and a page may be grouped as a program and read unit. The memory cells of the memory cell array 110 will be described in detail with reference to FIG. 2.

The row decoder 120 may be coupled with the memory cell array 110 through the word lines WL1 to WLm. The row decoder 120 may operate under the control of the control logic 160. The row decoder 120 may decode an address provided from an external device (not shown). The row decoder 120 may select and drive the word lines WL1 to WLm based on a decoding result. For instance, the row decoder 120 may provide the word lines WL1 to WLm with a word line voltage provided from the voltage generator 150.

The column decoder 130 may be coupled with the memory cell array 110 through the bit lines BL1 to BLn. The column decoder 130 may operate under the control of the control logic 160. The column decoder 130 may decode an address provided from the external device. The column decoder 130 may couple the bit lines BL1 to BLn with read/write circuits of the data read/write block 140, which respectively correspond to the bit lines BL1 to BLn, based on a decoding result. Also, the column decoder 130 may drive the bit lines BL1 to BLn based on the decoding result.

The data read/write block 140 may operate under the control of the control logic 160. The data read/write block 140 may operate as a write driver or a sense amplifier according to an operation mode. For example, the data read/write block 140 may operate as a write driver, which stores data provided from the external device into the memory cell array 110 during a program operation. For another example the data read/write block 140 may operate as a sense amplifier which reads out data from the memory cell array 110 during a read operation.

The voltage generator 150 may generate voltages for internal operations of the nonvolatile memory device 100. The voltages generated by the voltage generator 150 may be applied to the memory cells of the memory cell array 110. For example, a program voltage generated during the program operation may be applied to a word line of memory cells for which the program operation is to be performed. For another example, an erase voltage generated during the erase operation may be applied to a well area of memory cells for which the erase operation is to be performed. For still another example, a read voltage generated during a read operation may be applied to a word line of memory cells for which the read operation is to be performed.

The control logic 160 may control general operations of the nonvolatile memory device 100 in response to control signals provided from the external device. For example, the control logic 160 may control main operations of the nonvolatile memory device 100 such as the read, write and erase operations.)

When a special command for searching an erased page is provided from the external device, the control logic 160 may perform the read operation to program indicator cells of the memory cell array 110. The control logic 160 may provide the external device with a state of the program indicator cells (e.g., whether the program indicator cells are in an erased state or a programmed state). The read operation to the program indicator cells will be described below in detail.

Figure 2:
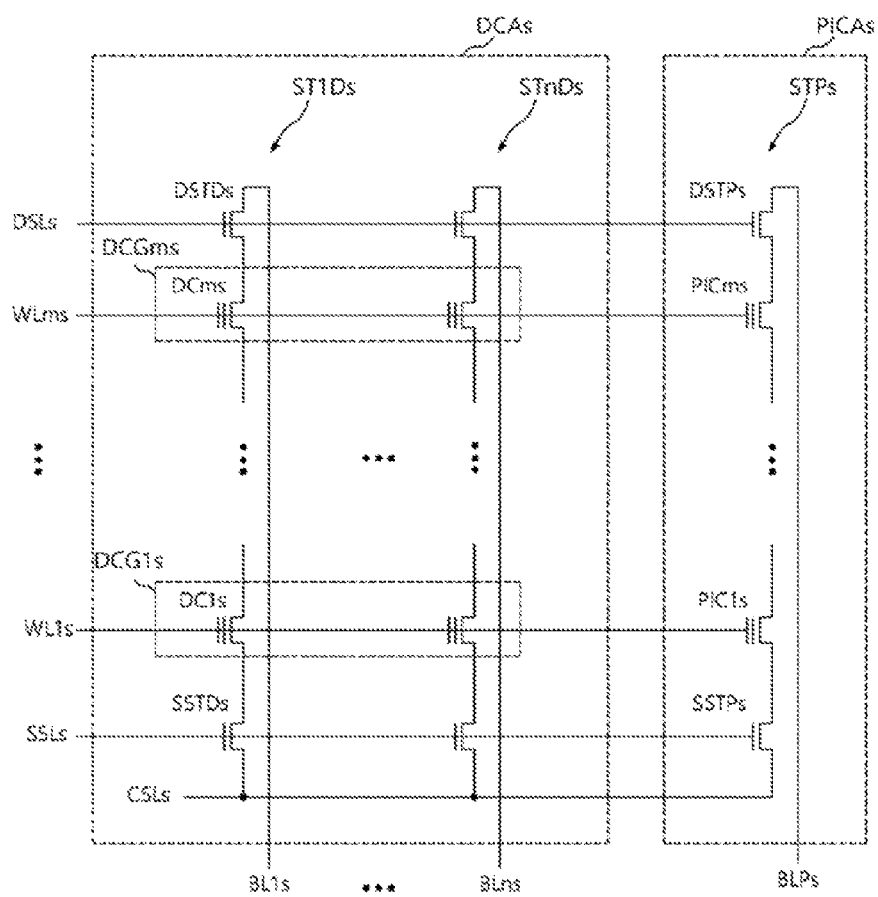
FIG. 2 is a circuit diagram illustrating a memory block configured by single level cells in accordance with an embodiment.

FIG. 2 is a circuit diagram illustrating a memory block BLKs configured by single level cells in accordance with an embodiment. The memory cell array 110 of the nonvolatile memory device 100 shown in FIG. 1 may include a plurality of memory blocks. Each of the plurality of memory blocks may be similar to the memory block BLKs shown in FIG. 2.

The memory block BLKs may include a data cell area DCAs and a program indicator cell area PICAs.

The data cell area DCAs may include a plurality of cell strings ST1Ds to STnDs which are coupled to a plurality of bit lines BL1s to BLns, respectively. The cell strings ST1Ds to STnDs are the same as one another, and one cell string ST1Ds will be representatively described below.

The cell string ST1Ds may include a plurality of data cells DC1s to DCms and select transistors DSTDs and SSTDs which are coupled between the bit line BL1s and a common source line CSLs. The cell string ST1Ds may include a drain select transistor DSTDs which is coupled to a drain select line DSLs, the data cells DC1s to DCms which respectively coupled to the word lines WL1s to WLms, and a source select transistor SSTDs which is coupled to a source select line SSLs.

The data cell area DCAs may store data provided from an external device (not shown). Although not shown, the data cell area DCAs may include a main area and a spare area. Data provided from the external device may be stored in the main area. The spare area may store information related with data stored in the main area (e.g., metadata such as error correction codes).

The program indicator cell area PICAs may include a program indicator cell string STPs which is coupled to a bit line BLPs. While the program indicator cell area PICAs including a single program indicator cell string STPs is shown in FIG. 2, it is to be noted that the program indicator cell area PICAs may include a plurality of program indicator cell strings.

The program indicator cell string STPs may include a plurality of program indicator cells PIC1s to PICms and select transistors DSTPs and SSTPs which are coupled between the bit line BLPs and the common source line CSLs. The program indicator cell string STPs may include a drain select transistor DSTPs which is coupled to the drain select line DSLs, the program indicator cells PIC1s to PICms which are respectively coupled to the word lines WL1s to WLms, and a source select transistor SSTPs which is coupled to the source select line SSLs.

Each of the program indicator cells PIC1s to PICms of the program indicator cell area PICAs may be used as a storage element for storing information representing whether corresponding data cells of the data cell area DCAs are programmed or erased. The program indicator cell area PICAs is a hidden area and access to which is restricted, unlike the data cell area DCAs.

The program indicator cell area PICAs will be described in further detail by taking as a representative example a first data cell group DCG1s (hereinafter, referred to as a "first page") of the data cell area DCAs and the first program indicator cell PIC1s corresponding thereto.

Figure 5:
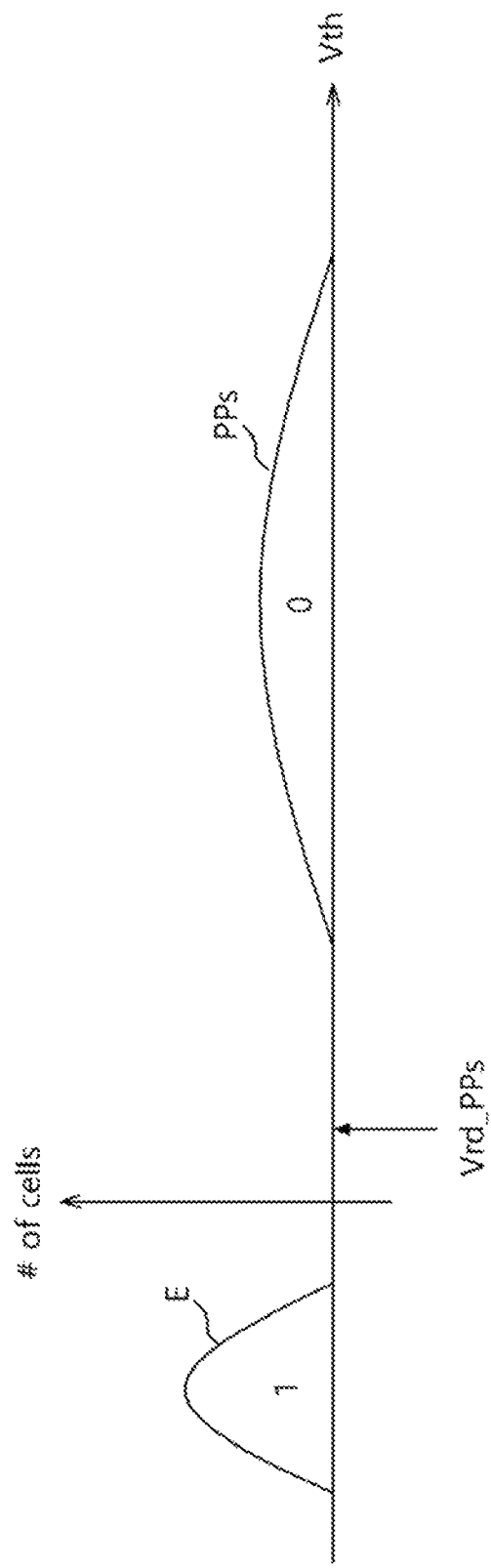
FIG. 5 is a diagram illustrating a threshold voltage distribution of program indicator cells.

Each of data cells of the first page DCG1s may store a single data bit. Such a data cell is referred to as a single level cell (SLC). In the case where the data cells of the first page DCG1s are programmed as the single level cells (SLC), the corresponding first program indicator cell PIC1s may be programmed. At this time, the first program indicator cell PIC1s may be programmed to have a threshold voltage of a program indicator programmed state PPs as shown in FIG. 5.

The first program indicator cell PIC1s may be programmed before programming the data cells of the first page DCG1s coupled to the same word line WL1s as the first program indicator cell PIC1s. The first program indicator cell PIC1s may store information representing whether the data cells of the corresponding first page DCG1s are programmed. For example, the programmed first program indicator cell PIC1s may store information representing that a program voltage for programming the data cells of the first page DCG1s is applied once or more. Conversely the erased first program indicator cell PIC1s may store information representing that the program voltage is not applied at all or that the data cells of the first page DCG1s are erased. That is to say, the first program indicator cell PIC1s may be an indicator cell indicating whether the corresponding first page DCG1s is programmed or erased.

Figure 3:
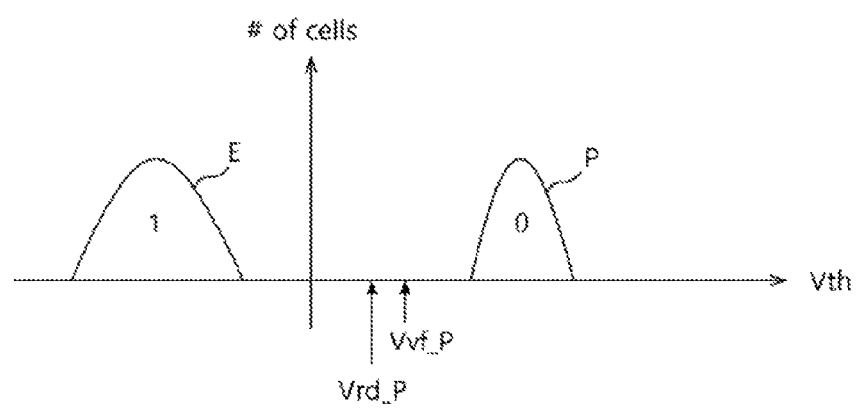
FIG. 3 is a diagram illustrating a threshold voltage distribution of data cells.

FIG. 3 is a diagram illustrating a threshold voltage distribution of data cells included in the memory block of FIG. 2. As shown in FIG. 3, a data cell as the single level cell (SLC) may be erased to have a threshold voltage of an erased state E, and be programmed to have a threshold voltage of a programmed state P.

During the read operation, a read voltage Vrd_P having a voltage level between the erased state E and the programmed state P may be applied to data cells. When the read voltage Vrd_P is applied, a data cell having a threshold voltage of the erased state E may be determined as an "on-cell" which stores data "1," and a data cell having a threshold voltage of the programmed state P may be determined as an "off-cell" which stores data "0."

During the program operation, in order to determine whether data cells are properly programmed, a program verify voltage Vvf_P having a voltage level higher than the read voltage Vrd_P may be applied to the data cells. When the program verify voltage Vvf_P is applied, a data cell which has a threshold voltage lower than the program verify voltage Vvf_P may be determined as the "on-cell" which stores data "1" (e.g., a cell which is not properly programmed) and a data cell which has a threshold voltage higher than the program verify voltage Vvf_P may be determined as the "off-cell" which stores data "0" (e.g., a cell which is properly programmed).

Figure 4:
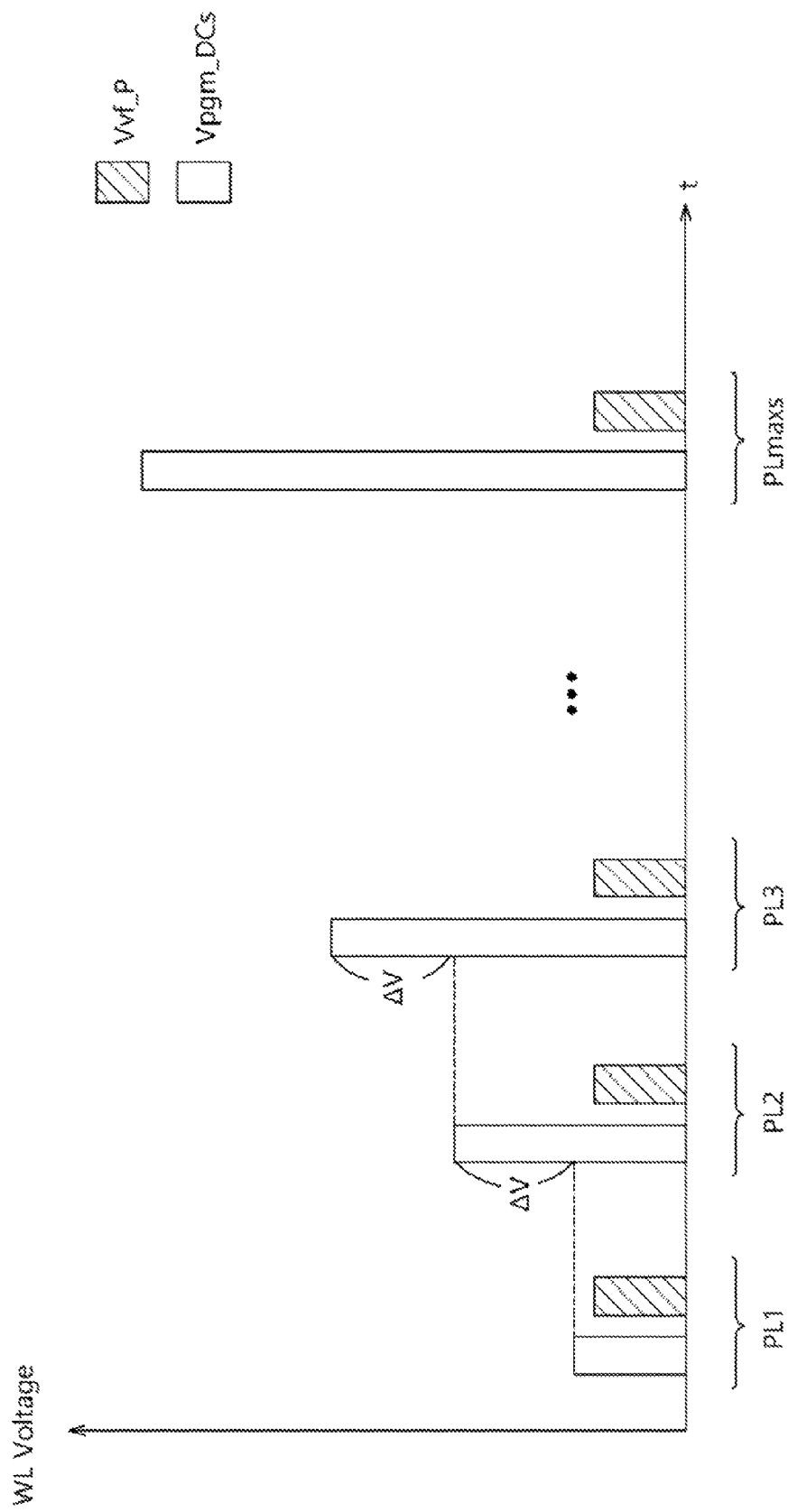
FIG. 4 is a diagram illustrating a program voltage and a verify voltage.

FIG. 4 is a diagram illustrating the program voltage and the verify voltage which are applied during the program operation for data cells of FIG. 2. In order to have a dense threshold voltage distribution and secure a margin between the erased state E and the programmed state P, data cells may be programmed through an incremental step pulse program (ISPP) scheme.

According to the incremental step pulse program scheme, a program voltage Vpgm_DCs as a single pulse may be applied to data cells, and then, the verify voltage Vvf_P may be applied to verify whether the data cells are properly programmed. In other words, the verify voltage Vvf_P may be applied each time the program voltage Vpgm_DCs is applied to data cells. An operation of applying the program voltage Vpgm_DCs and an operation of applying the verify voltage Vvf_P may be configured as a single program loop PL.

After a program verification operation is performed, when a data cell is determined as not properly programmed the program voltage Vpgm_DCs increased by an increment ΔV (i.e., a step voltage or a step pulse) and the program verify voltage Vvf_P may be applied again to the data cell. Namely, the program loop PL may be repeated until the data cell is properly programmed to a desired threshold voltage. When the data cell is not properly programmed to a desired threshold voltage even though a maximum program loop PLmaxs is performed, the program operation may be ended as a "fail."

FIG. 5 is a diagram illustrating a threshold voltage distribution of the program indicator cells of FIG. 2. As shown in FIG. 5, the program indicator cell may be erased to have a threshold voltage of an erased state E, and be programmed to have a threshold voltage of the program indicator programmed state PPs.

During the read operation a read voltage Vrd_PPs having a voltage level between the erased state E and the program indicator programmed state PPs may be applied to a program indicator cell. When the read voltage Vrd_PPs is applied, the program indicator cell having a threshold voltage of the erased state E may be determined as the "on-cell" which stores data "1" and the program indicator cell having a threshold voltage of the program indicator programmed state PPs may be determined as the "off-cell" which stores data "0."

Figure 6:
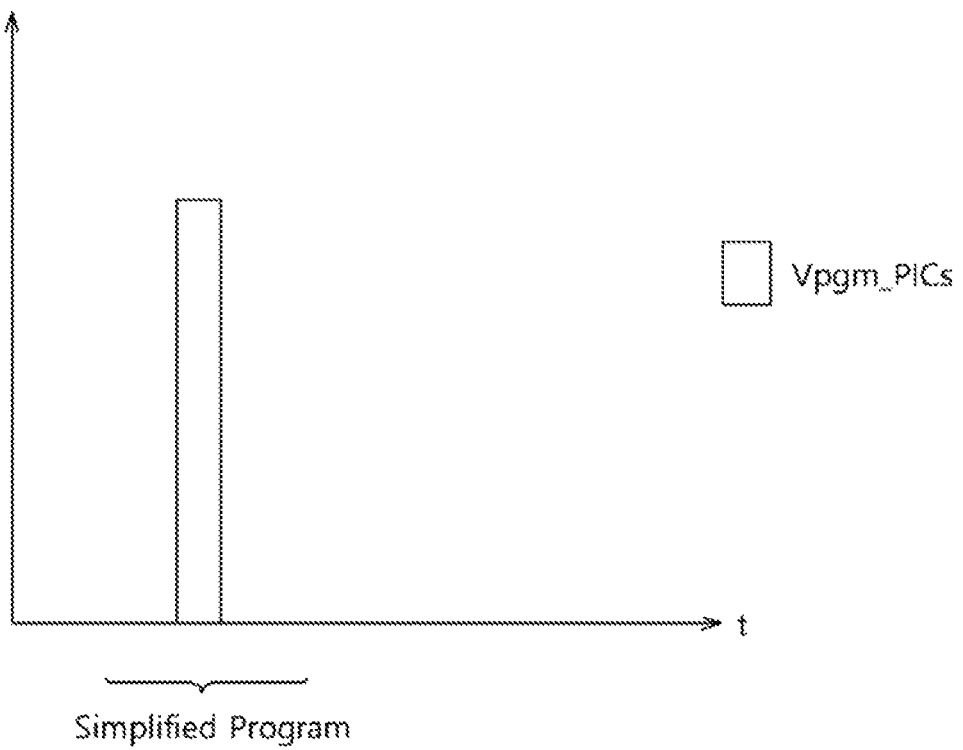
FIG. 6 is a diagram illustrating a program voltage which is applied in a program operation for program indicator cells.

FIG. 6 is a diagram illustrating the program voltage which is applied during the program operation for the program indicator cells of FIG. 2.

The program indicator cells may be programmed before the program operation for data cells. In order to minimize a time required to program the program indicator cells, the program indicator cells may be programmed by using a simplified program scheme instead of the ISPP scheme.

According to the simplified program scheme the program verification operation may also be omitted. That is to say, according to the simplified program scheme a program voltage Vpgm_PICs is applied only once to the program indicator cell.

The program voltage Vpgm_PICs having a high voltage level may be applied to the program indicator cell such that a threshold voltage of the program indicator cell is higher than the read voltage Vrd_PPs for reading the program indicator cell even though the program voltage Vpgm_PICs is applied once. For example, the program operation for the program indicator cell may be performed with the program voltage Vpgm_PICs having the same voltage level as the program voltage Vpgm_DCs of the maximum program loop PLmaxs applied to the data cell during the program operation for the data cell as shown in FIG. 4.

Figure 7:
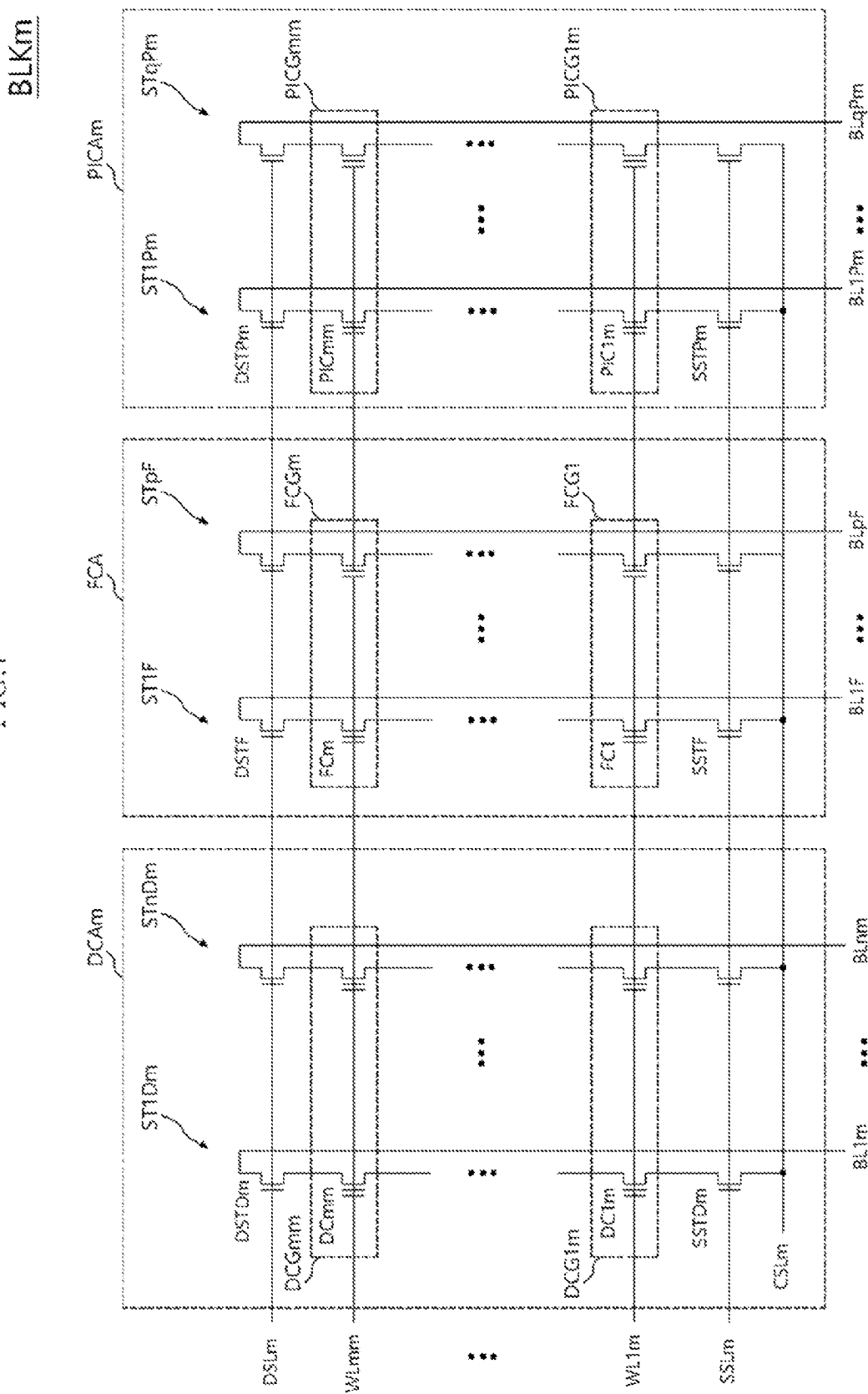
FIG. 7 is a circuit diagram illustrating a memory block configured by multi-level cells in accordance with an embodiment.

FIG. 7 is a circuit diagram illustrating a memory block BLKm configured by multi-level cells in accordance with an embodiment. The memory cell array 110 of the nonvolatile memory device 100 shown in FIG. 1 may include a plurality of memory blocks. Each of the plurality of memory blocks may be the same as the memory block BLKm shown in FIG. 7.

The memory block BLKm may include a data cell area DCAm, a flag cell area FCA, and a program indicator cell area PICAm.

The data cell area DCAm may include a plurality of cell strings ST1Dm to ST1Dm which are coupled to a plurality of bit lines BL1m to BLnm, respectively. The cell strings ST1Dm to STnDm are the same as one another, and one cell string ST1Dm will be representatively described below.

The cell string ST1Dm may include a plurality of data cells DC1m to DCmm and select transistors DSTDm and SSTDm which are coupled between the bit line BL1m and a common source line CSLm. The cell string ST1Dm may include a drain select transistor DSTDm which is coupled to a drain select line DSLm the data cells DC1m to DCmm which are respectively coupled to the word lines WL1m to WLmm, and a source select transistor SSTDm which is coupled to a source select line SSLm.

The data cell area DCAm may store data provided from an external device (not shown). Although not shown, the data cell area DCAm may include a main area and a spare area. Data provided from the external device may be stored in the main area. The spare area may store information related with data stored in the main area (e.g., metadata such as error correction codes).

The flag cell area FCA may include a plurality of flag cell strings ST1F to STpF which are coupled to a plurality of bit lines BL1F to BLpF, respectively. The flag cell strings ST1F to STpF are the same as one another, and one flag cell string ST1F will be representatively described below.

The flag cell string ST1F may include a plurality of flag cells FC1 to FCm and select transistors DSTF and SSTF which are coupled between the bit line BL1F and the common source line CSLm. The flag cell string ST1F may include a drain select transistor DSTF which is coupled to the drain select line DSLm, the flag cells FC1 to FCm which are respectively coupled to the word lines WL1m to WLmm and a source select transistor SSTF which is coupled to the source select line SSLm.

Flag cells of the flag cell area FCA may be used as storage elements for storing information representing whether upper bit data is programmed in any one of data cells of the corresponding data cell area DCAm. The flag cell area FCA is a hidden area and access to which is restricted unlike the data cell area DCAm.

The flag cell area FCA will be described in further detail by taking as a representative example a first data cell group DCG1m of the data cell area DCAm and a first flag cell group FCG1 corresponding thereto.

Figure 8:
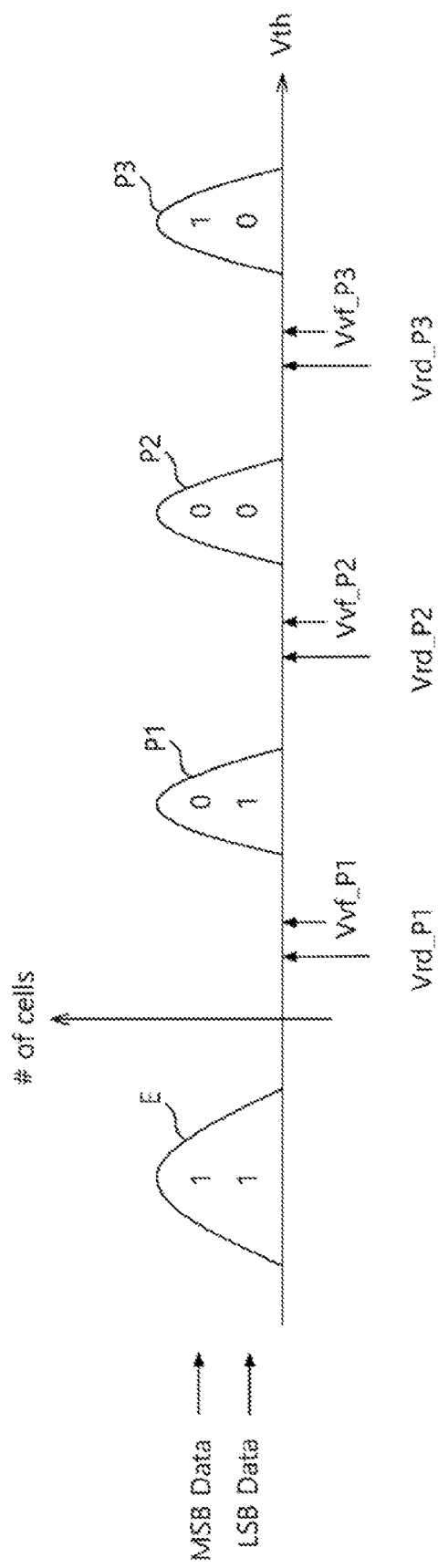
FIG. 8 is a diagram illustrating a threshold voltage distribution of data cells.

Each of data cells of the first data cell group DCG1m may store a plurality of data bits. Such a data cell is referred to as a multi-level cell (MLC). For instance, as shown in FIG. 8, each 2-bit multi-level cell (MLC) may be erased to have a threshold voltage of an erased state E, and be programmed to have a threshold voltage of any one among a plurality of programmed states P1, P2 and P3, according to multi-bit data.

Figure 9:
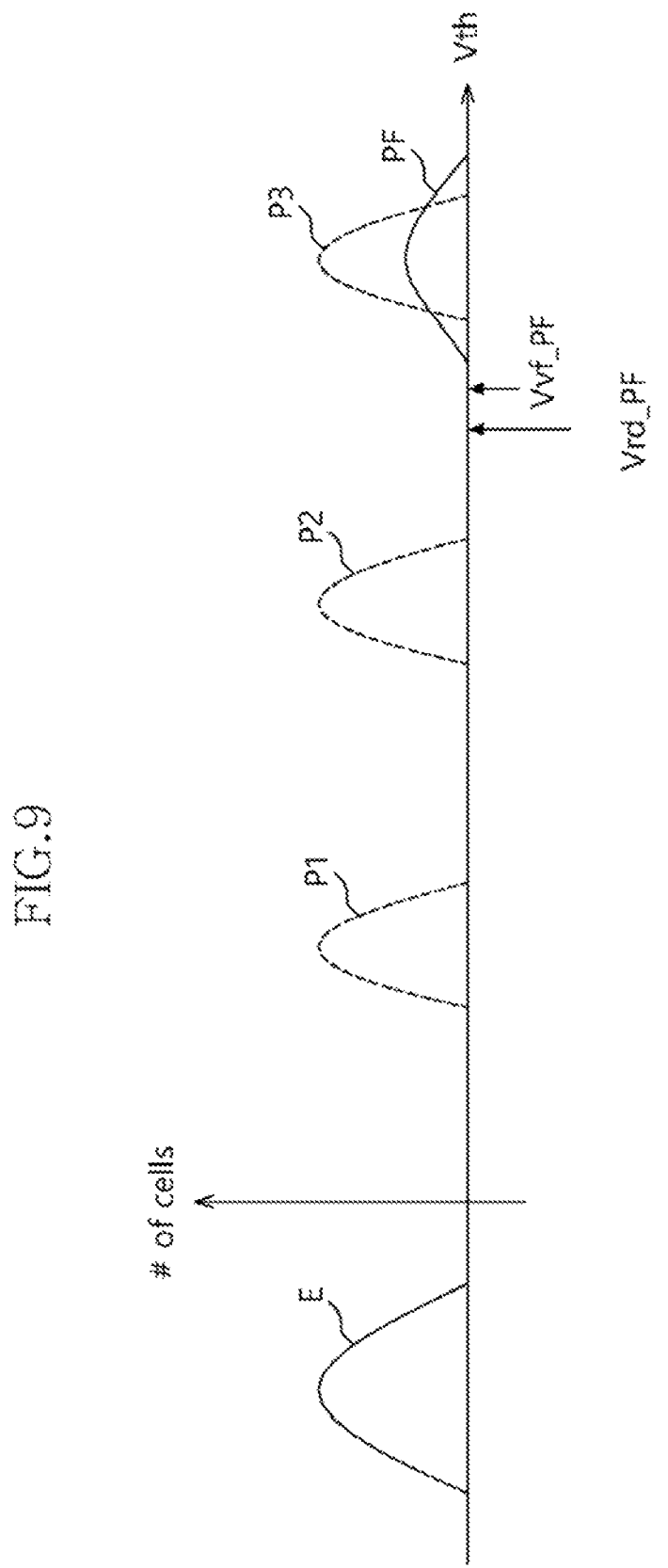
FIG. 9 is a diagram illustrating a threshold voltage distribution of flag cells.

In the case where each of the data cells of the first data cell group DCG1m stores 2-bit data, the upper bit data or MSB data and a lower bit data or LSB data may be programmed in each of the data cells. When the MSB data is programmed in any one of the data cells of the first data cell group DCG1m, all flag cells of the corresponding first flag cell group FCG1 may be programmed. At this time, each of the flag cells of the first flag cell group FCG1 may be programmed to have a threshold voltage of a flag programmed state PF as shown in FIG. 9.

An MSB read operation for the first data cell group DCG1m may be different according to whether the first flag cell group FCG1 is programmed or not. For example, when it is determined that the flag cells of the first flag cell group FCG1 are programmed, the MSB read operation for the data cells of the first data cell group DCG1m may be normally performed. Conversely, when it is determined that the flag cells of the first flag cell group FCG1 are not programmed, the MSB read operation for the data cells of the first data cell group DCG1m may not be performed.

Data stored in each flag cell of the first flag cell group FCG1 may be changed or corrupted for various reasons. Thus, the flag cells of the first flag cell group FCG1 may be read through an error correction. As such, a majority check method may be used. According to the majority check method, even though different data are stored in the flag cells of the first flag cell group FCG1, a majority of the stored data may be determined as representative data stored in the first flag cell group FCG1.

The program indicator cell area PICAm may include a plurality of program indicator cell strings ST1Pm to STqPm which are coupled to a plurality of bit lines BL1Pm to BLqPm, respectively. The program indicator cell strings ST1Pm to STqPm are the same as one another, and for the sake of convenience in explanation, one program indicator cell string ST1Pm will be representatively described below.

The program indicator cell string ST1Pm may include a plurality of program indicator cells PIC1m to PICmm and select transistors DSTPm and SSTPm which are coupled between the bit line BL1Pm and the common source line CSLm. The program indicator cell string ST1Pm may include a drain select transistor DSTPm which is coupled to the drain select line DSLm, the program indicator cells PIC1m to PICmm which are respectively coupled to the word lines WL1m to WLmm, and a source select transistor SSTPm which is coupled to the source select line SSLm.

The program indicator cells PIC1m to PICmm of the program indicator cell area PICAm may be used as storage elements for storing information representing whether data cells of the data cell area DCAm are programmed or erased. The program indicator cell area PICAm is a hidden area and access to which is restricted unlike the data cell area DCAm.

The program indicator cell area PICAm will be described in further detail by taking as a representative example the first data cell group DCG1m of the data cell area DCAm and a first program indicator cell group PICG1m corresponding thereto.

Figure 11:
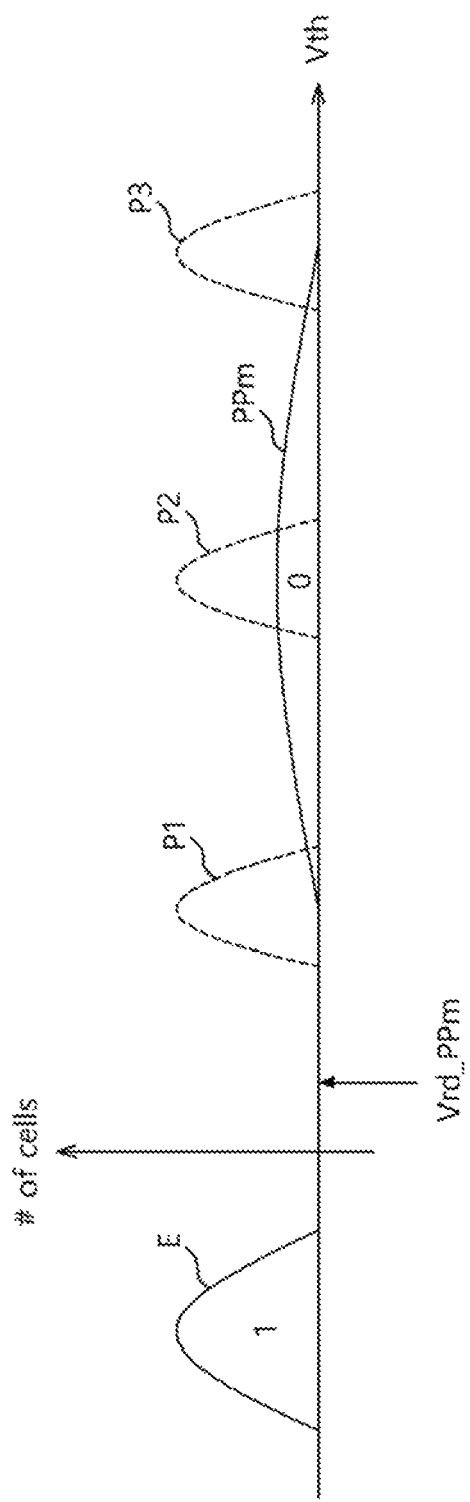
FIG. 11 is a diagram illustrating a threshold voltage distribution of program indicator cells.

Each of data cells of the first data cell group DCG1m may be a multi-level cell (MLC). In the case where the data cells of the first data cell group DCG1m are programmed as the MLC, the corresponding first program indicator cell group PICG1m may be programmed. At this time, the first program indicator cell group PICG1m may be programmed to have a threshold voltage of a program indicator programmed state PPm as shown in FIG. 11.

Program indicator cells of the first program indicator cell group PICG1m may be programmed before programming the data cells of the first data cell group DCG1m coupled to the same word line WL1m as the first program indicator cell group PICG1m. In other words, the program indicator cells of the first program indicator cell group PICG1m may be programmed before storing LSB data or MSB data to the data cells of the first data cell group DCG1m.

The program indicator cells of the first program indicator cell group PICG1m may store information representing whether the data cells of the corresponding first data cell group DCG1m are programmed. For example, the programmed program indicator cells of the first program indicator cell group PICG1m may store information representing that a program voltage for programming the data cells of the corresponding first data cell group DCG1m is applied once or more. Conversely, the erased program indicator cells of the first program indicator cell group PICG1m may store information representing that the program voltage is not applied at all or that the data cells of the first data cell group DCG1m are erased. That is to say, the program indicator cells of the first program indicator cell group PICG1m may be indicator cells indicating whether the corresponding first data cell group DCG1m is programmed or erased.

Data stored in each program indicator cell of the first program indicator cell group PICG1m may be changed or corrupted for various reasons. Thus, the program indicator cells of the first program indicator cell group PICG1m may be read through an error correction. As such, a majority check method may be used. According to the majority check method, even though different data are stored in the program indicator cells of the first program indicator cell group PICG1m, a majority of the stored data may be determined as representative data stored in the first program indicator cell group PICG1m.

FIG. 8 is a diagram illustrating a threshold voltage distribution of data cells included in the memory block of FIG. 7. As shown in FIG. 8, a 2-bit MLC type data cell may be erased to have a threshold voltage of the erased state E, and be programmed to have a threshold voltage of any one among the plurality of programmed states P1, P2 and P3.

During the read operation, any one of a first read voltage Vrd_P1 having a voltage level between the erased state E and the first programmed state P1, a second read voltage Vrd_P2 having a voltage level between the first programmed state P1 and the second programmed state P2, and a third read voltage Vrd_P3 having a voltage level between the second programmed state P2 and the third programmed state P3 may be applied to data cells.

When the second read voltage Vrd_P2 is applied, data cells having threshold voltages of the erased state E and the first programmed state P1 may be determined as the "on-cells" which store LSB data and data cells having threshold voltages of the second programmed state P2 and the third programmed state P3 may be determined as the "off-cells" which store LSB data "0."

When the first read voltage Vrd_P3 is applied, a data cell having a threshold voltage of the erased state E may be determined as the "on-cell" which stores MSB data "1," and a data cell having a threshold voltage of the first programmed state P1 may be determined as the "off-cell" which stores MSB data "0."

When the third read voltage Vrd_P3 is applied a data cell having a threshold voltage of the second programmed state P2 may be determined as the "on-cell" which stores MSB data "0," and a data cell having a threshold voltage of the third programmed state P3 may be determined as the "off-cell" which stores MSB data "1."

During the program operation, to determine whether data cells are properly programmed, program verify voltages Vvf_P1, Vvf_P2 and Vvf_P3 having voltage levels higher than the read voltages Vrd_P1, Vrd_P2 and Vrd_P3, respectively, may be applied to the data cells.

When the program verify voltage Vvf_P1 is applied to data cells which should be programmed to the first programmed state P1, a data cell which has a threshold voltage lower than the program verify voltage Vvf_P1 may be determined as the "on-cell" which stores data "1" (e.g., a cell which is not properly programmed), and a data cell which has a threshold voltage higher than the program) verify voltage Vvf_P1 may be determined as the "off-cell" which stores data "0" (e.g., a cell which is properly programmed).

When the program verify voltage Vvf_P2 is applied to data cells which should be programmed to the second programmed state P2, a data cell which has a threshold voltage lower than the program verify voltage Vvf_P2 may be determined as the "on-cell" which stores data "1" (e.g., a cell which is not properly programmed), and a data cell which has a threshold voltage higher than the program verify voltage Vvf_P2 may be determined as the "off-cell" which stores data "0" (e.g., a cell which is properly programmed).

When the program verify voltage Vvf_P3 is applied to data cells which should be programmed to the third programmed state P3, a data cell which has a threshold voltage lower than the program verify voltage Vvf_P3 may be determined as the "on-cell" which stores data "1" (e.g. a cell which is not properly programmed), and a data cell which has a threshold voltage higher than the program verify voltage Vvf_P3 may be determined as the "off-cell" which stores data "0" (e.g., a cell which is properly programmed).

FIG. 9 is a diagram illustrating a threshold voltage distribution of flag cells of FIG. 7. As shown in FIG. 9, a flag cell may be erased to have a threshold voltage of an erased state E, and be programmed to have a threshold voltage of the flag programmed state PF.

During the read operation, a read voltage Vrd_PF having a voltage level between the erased state E and the flag programmed state PF may be applied to flag cells. When the read voltage Vrd_PF is applied a flag cell having a threshold voltage of the erased state E may be determined as the "on-cell" which stores data "1," and a flag cell having a threshold voltage of the flag programmed state PF may be determined as the "off-cell" which stores data "0."

During the program operation, in order to determine whether flag cells are properly programmed, a program verify voltage Vvf_PF having a voltage level higher than the read voltage Vrd_PF may be applied to the flag cells. When the program verify voltage Vvf_PF is applied, a flag cell which has a threshold voltage lower than the program verify voltage Vvf_PF may be determined as the "on-cell" which stores data "1" (e.g., a cell which is not properly programmed) and a flag cell which has a threshold voltage higher than the program verify voltage Vvf_PF may be determined as the "off-cell" which stores data "0" (e.g. a cell which is properly programmed).

The program operation to the flag cells may be performed during the program operation for corresponding data cells. Further, the program operation to the flag cells may be completed before the program operation to corresponding data cells is completed.

Figure 10:
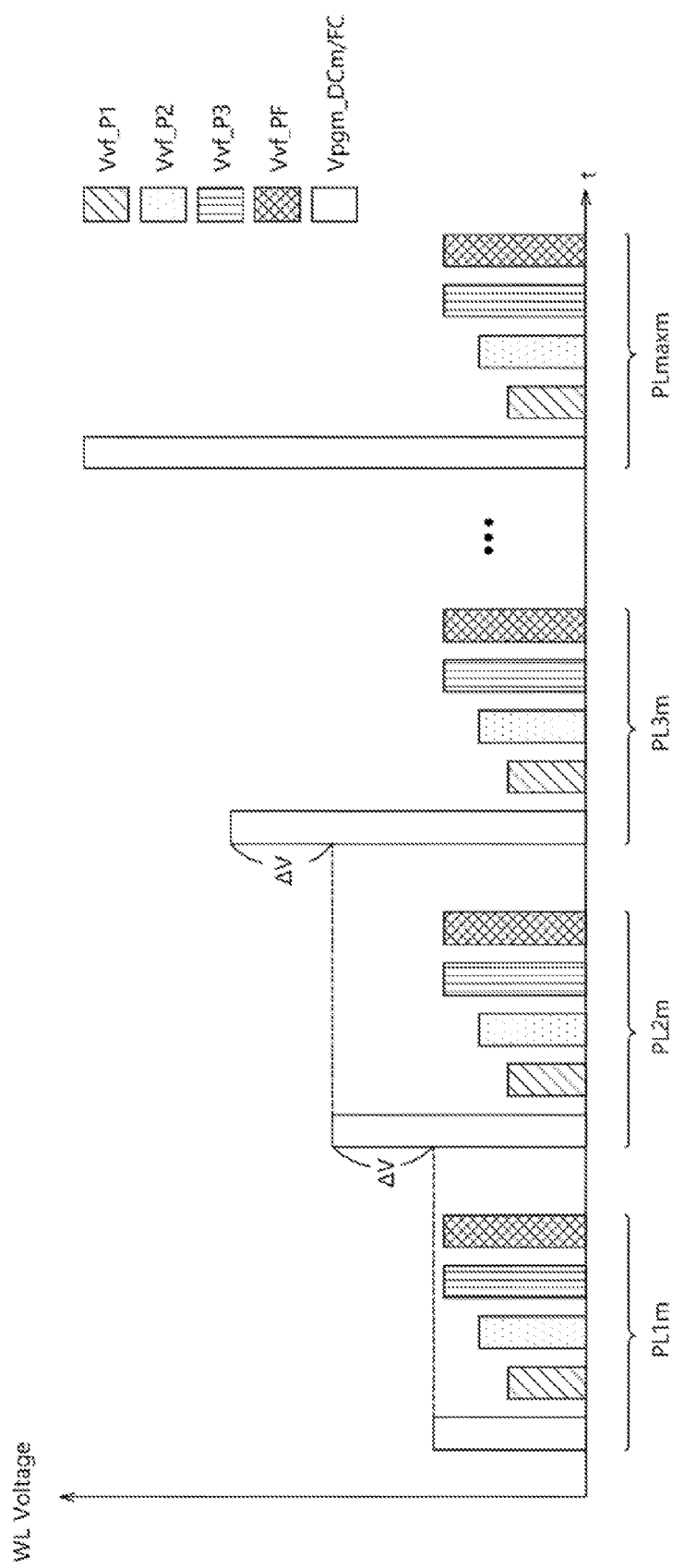
FIG. 10 is a diagram illustrating a program voltage and verify voltages.

FIG. 10 is a diagram illustrating the program voltage and the verify voltages which are applied during program operations for the data cells and the flag cells of FIG. 7. In order to have a dense threshold voltage distribution and secure a margin between the erased state E and the programmed states P1, P2, P3 and PF, data cells and flag cells may be programmed through the ISPP scheme.

According to the incremental step pulse program scheme a program voltage Vpgm_DCm/FC as a single pulse may be applied to data cells and flag cells, and then, the verify voltages Vvf_P1, Vvf_P2, Vvf_P3 and Vvf_PF may be applied to verify whether the data cells and the flag cells are properly programmed. In other words the verify voltages Vvf_P1, Vvf_P2, Vvf_P3 and Vvf_PF may be applied each time the program voltage Vpgm_DCm/FC is applied to the data cells and the flag cells. An operation of applying the program voltage Vpgm_DCm/FC and an operation of applying the verify voltages Vvf_P1, Vvf_P2, Vvf_P3 and Vvf_PF may be configured as a single program loop PL.

After a program verification operation is performed, when a data cell and a flag cell are determined as not properly programmed, a program voltage Vpgm_DCm/FC increased by an increment ΔV (i.e., a step voltage or a step pulse) and the program verify voltages Vvf_P1, Vvf_P2, Vvf_P3 and Vvf_PF may be applied again to the data cell and the flag cell. Namely, the program loop PL may be repeated until the data cell and the flag cell are properly programmed to desired threshold voltages. When the data cell and the flag cell are not programmed to desired threshold voltages even though a maximum program loop PLmaxm is performed, the program operation may be ended as a "fail."

FIG. 11 is a diagram illustrating a threshold voltage distribution of the program indicator cells of FIG. 7. As shown in FIG. 11, the program indicator cell may be erased to have a threshold voltage of an erased state E, and be programmed to have a threshold voltage of the program indicator programmed state PPm.

During the read operation, a read voltage Vrd_PPm having a voltage level between the erased state E and the program indicator programmed state PPm may be applied to program indicator cells. When the read voltage Vrd_PPm is applied, the program indicator cell having a threshold voltage of the erased state E may be determined as the "on-cell" which stores data "1," and a program indicator cell having a threshold voltage of the program indicator programmed state PPm may be determined as the "off-cell" which stores data "0."

Figure 12:
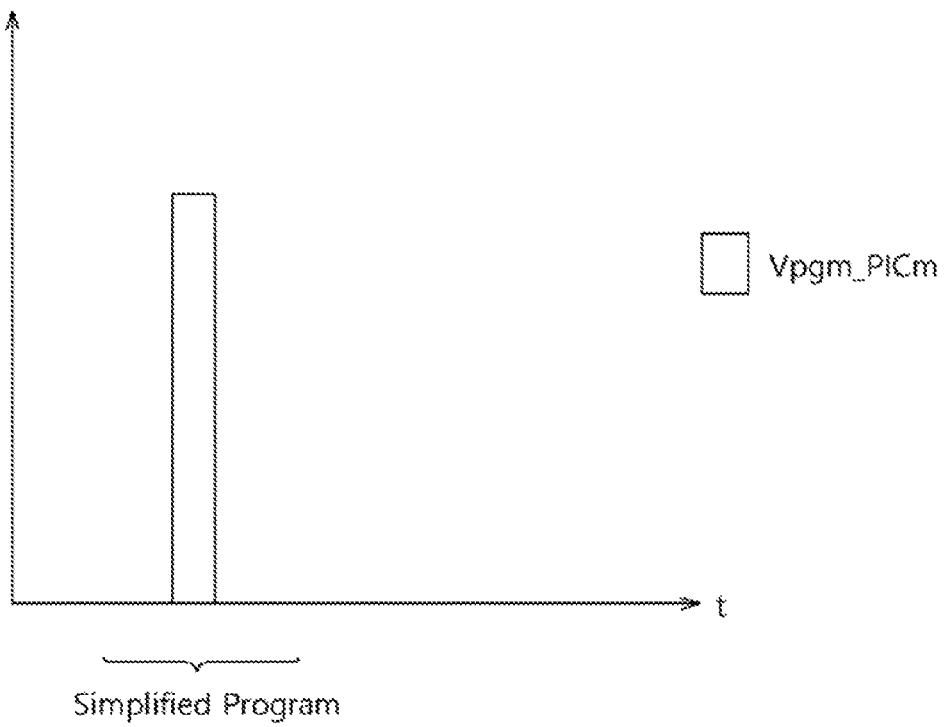
FIG. 12 is a diagram illustrating a program voltage which is applied in a program operation for program indicator cells.

FIG. 12 is a diagram illustrating the program voltage which is applied during the program operation for program indicator cells included in the memory block of FIG. 7.

The program indicator cells may be programmed before the program operation for data cells. In order to minimize a time required to the program indicator cells, the program indicator cells may be programmed by using a simplified program scheme instead of the ISPP scheme.

According to the simplified program scheme, the program verification operation may also be omitted. That is to say, according to the simplified program scheme, a program voltage Vpgm_PICm as a single pulse is applied to the program indicator cells.

The program voltage Vpgm_PICm having a high voltage level may be applied to the program indicator cells such that threshold voltages of the program indicator cells are higher than the read voltage Vrd_PPm for reading the program indicator cells even though the program voltage Vpgm_PICm is applied once. For example, the program operation for the program indicator cells may be performed with the program voltage Vpgm_PICm having the same voltage level as the program voltage Vpgm_DCm/FC of the maximum program loop PLmaxs applied to the data cell during the program operation for the data cell as shown in FIG. 10.

Figure 13:
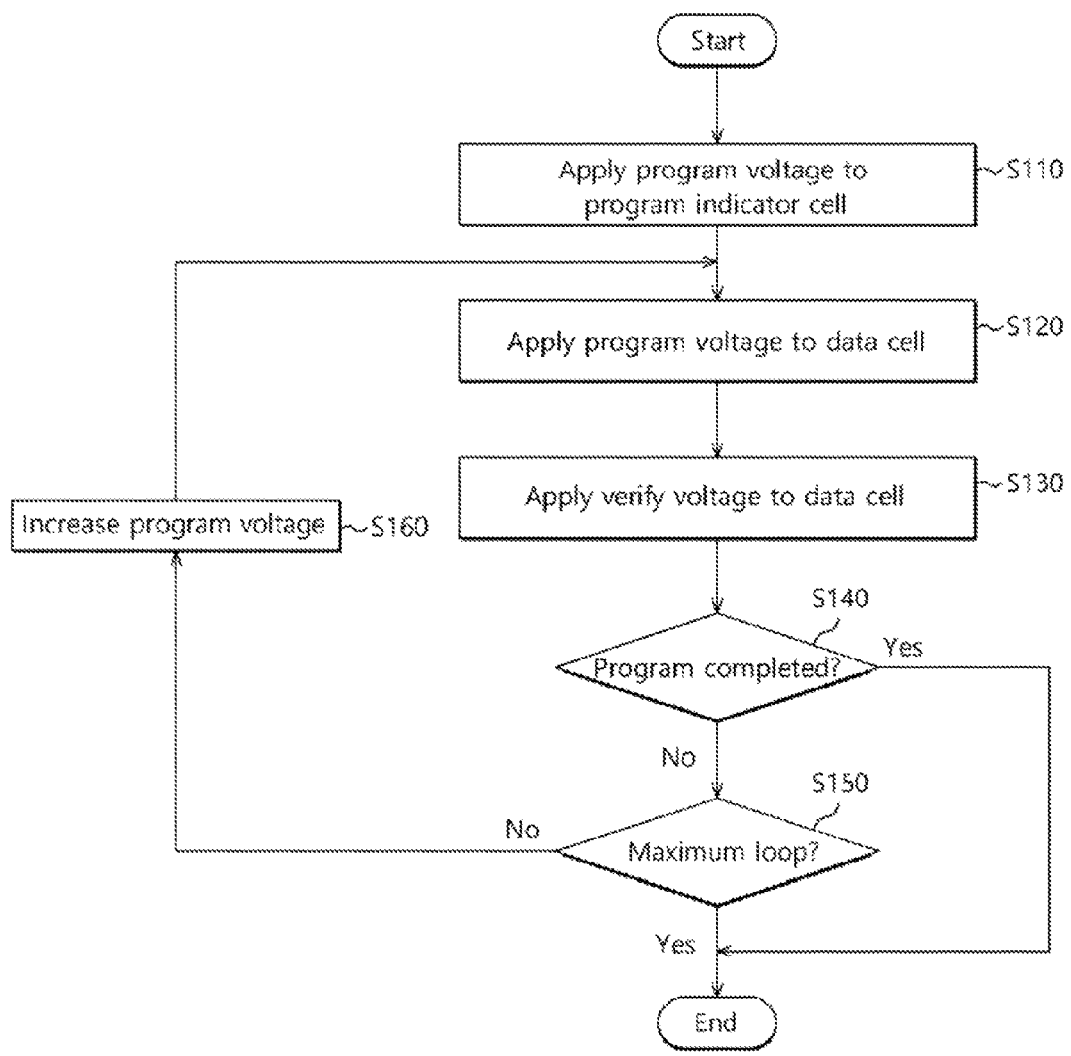
FIG. 13 is a flow chart illustrating a program operation of a nonvolatile memory device in accordance with an embodiment.

FIG. 13 is a flow chart illustrating the program operation of a nonvolatile memory device in accordance with an embodiment. In describing FIG. 13, it is assumed that a program command and an address for which the program command is to be executed are provided to the nonvolatile memory device 100 from an external device, for example, a controller.

The program operation of the nonvolatile memory device 100 may be performed by the control logic 160 and respective elements controlled by the control logic 160 (e.g. the row decoder 120, the column decoder 130, the data read/write block 140 and the voltage generator 150).

At step S110, the program voltage (e.g. Vpgm_PICs or Vpgm_PICm) may be applied to the program indicator cell corresponding to the provided address. As described above, according to the simplified program scheme, the program voltage is applied only once to the program indicator cell.

At step S120, the program voltage (e.g., Vpgm_DCs or Vpgm_DCm/FC) may be applied to the data cell of the provided address.

At step S130, the program verify voltage (e.g., Vvf_P or one of Vvf_P1, Vvf_P2, Vvf_P3 and Vvf_PF) may be applied to the data cell.

At step S140, whether the data cell to which the verify voltage is applied is properly programmed may be determined. In the case where the data cell is properly programmed, the program operation may be normally ended. Conversely, in the case where the data cell is not properly programmed, the process may proceed to step S150.

At the step S150, whether the program loop for programming the data cell is the maximum loop (e.g. PLmaxs) may be determined. In the case where the program loop is the maximum loop, the program operation may be ended as a fail. Conversely, in the case where the program loop is not the maximum loop, the process may proceed to step S160.

At the step S160, the program voltage for programming the data cell may be increased by the increment ΔV (i.e., the step voltage or the step pulse). Then, the process may proceed to the step S120 such that the increased program voltage is applied to the data cell.

In this way, the program operation of the nonvolatile memory device 100 may include the program operation (i.e., step S110) for the program indicator cell corresponding to the provided address, and the program operation (i.e. steps S120 to S160) for the data cell of the provided address.

Figure 14:
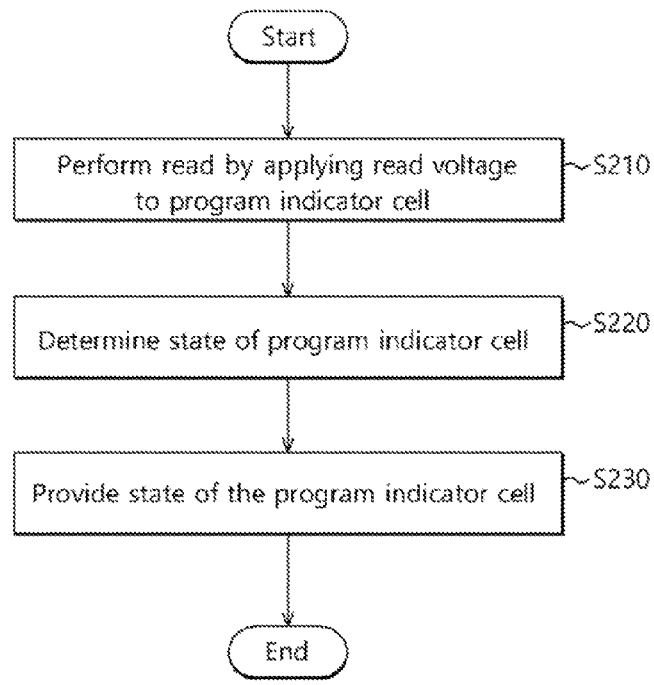
FIG. 14 is a flow chart illustrating a read operation for a program indicator cell of a nonvolatile memory device in accordance with an embodiment.

FIG. 14 is a flow chart illustrating the read operation to the program indicator cell of the nonvolatile memory device 100 in accordance with an embodiment. In describing FIG. 14, it is assumed that the nonvolatile memory device 100 is controlled according to a search command and an address provided from an external device, for example a controller. The search command may be provided to search an erased page. In response to the search command, the nonvolatile memory device 100 may perform the read operation to the program indicator cell corresponding to the address provided together with the search command.

The read operation to the program indicator cell of the nonvolatile memory device 100 may be performed by the control logic 160 and respective elements controlled by the control logic 160 (e.g., the row decoder 120, the column decoder 130, the data read/write block 140 and the voltage generator 150).

At step S210, the read voltage (e.g., Vrd_P or Vrd_PPm) may be applied to the program indicator cell corresponding to the provided address.

At step S220, a state of the program indicator cell to which the read voltage is applied may be determined. That is to say, it may be determined whether the program indicator cell is the "on-cell" storing data "1" or the "off-cell" storing data "0".

At step S230 the state of the program indicator cell may be provided to the controller that provided the search command. In other words, according to the determination of step S220, information representing whether a data cell of the provided address is a programmed state (i.e., a program voltage is applied once or more to the data cell of the provided address) or an erased state may be provided to the controller.

Figure 15:
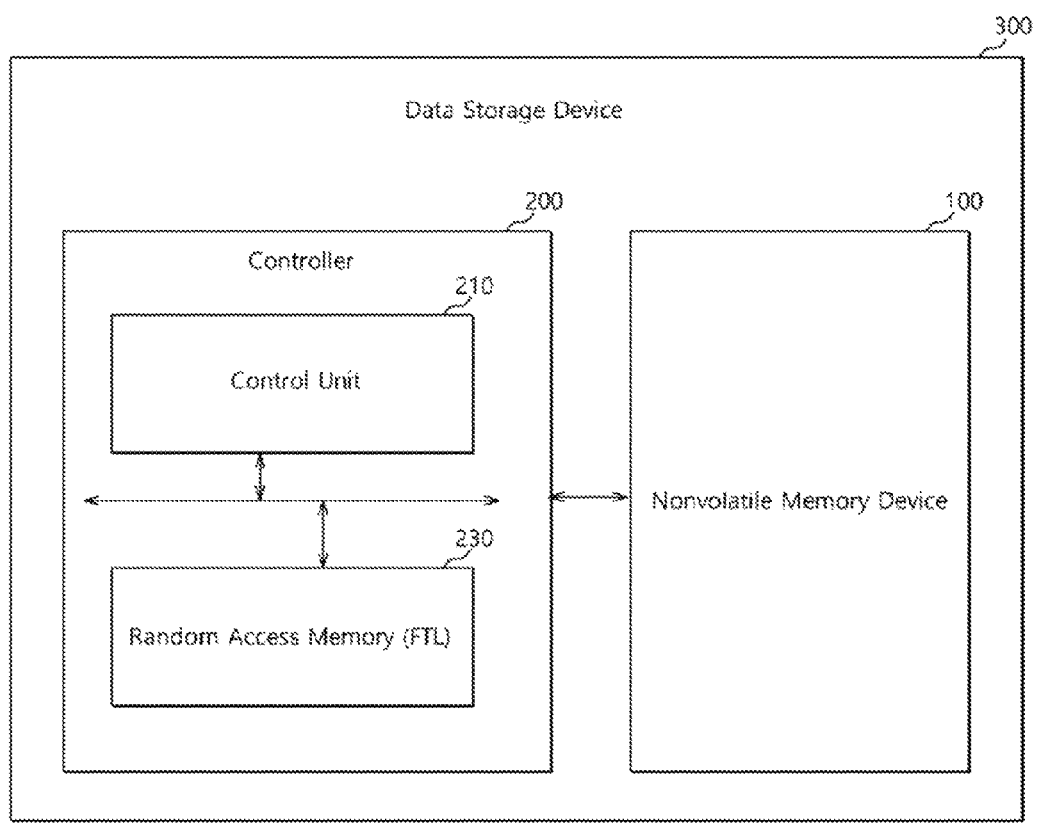
FIG. 15 is a block diagram illustrating a data storage device in accordance with an embodiment.

FIG. 15 is a block diagram illustrating a data storage device in accordance with an embodiment. A data storage device 300 may store data to be accessed by a host device (not shown) such as a mobile phone, an MP3 player, a laptop computer, a desktop computer, a game player, a TV, an in-vehicle infotainment system, and so forth. The data storage device 300 may also be referred to as a memory system.

The data storage device 300 may be manufactured as any one of various kinds of storage devices according to the protocol of an interface which is electrically coupled with the host device. For example, the data storage device 300 may be configured as any one of various kinds of storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The data storage device 300 may be manufactured as any one of various kinds of package types. For example, the data storage device 300 may be manufactured as any one of various kinds of package types such as a package-on-package (POP), a system package (SIP), a system-on-chip (SOC), a multi-chip package (MCP), a chip-on-board (COB) a wafer-level fabricated package (WFP) and a wafer-level stack package (WSP).

The data storage device 300 may include the nonvolatile memory device 100. The nonvolatile memory device 100 may operate as a storage medium of the data storage device 300. The nonvolatile memory device 100 may be configured by any one of various types of nonvolatile memory devices such as a flash memory device, a ferroelectric random access memory (FRAM) using a ferroelectric capacitor, a magnetic random access memory (MRAM) using a tunneling magneto-resistive (TMR) layer, a phase change random access memory (PRAM) using a chalcogenide alloy, and a resistive random access memory (RERAM) using a transition metal oxide, according to memory cells.

The data storage device 300 may include a controller 200. The controller 200 may include a control unit 210 and a random access memory 230.

The control unit 210 may control the general operations of the controller 200. The control unit 210 may analyze and process a signal or a request which is inputted from the host device. To this end, the control unit 210 may decode and drive a firmware or a software loaded on the random access memory 230. The control unit 210 may be realized in the form of a hardware or in the combined form of a hardware and a software.

The random access memory 230 may store a firmware or a software to be driven by the control unit 210. Also the random access memory 230 may store data necessary for the driving of the firmware or the software for example, meta-data. That is to say, the random access memory 230 may operate as a working memory of the control unit 210. The random access memory 230 may temporarily store data to be transmitted from the host device to the nonvolatile memory device 100 or from the nonvolatile memory device 100 to the host device. In other words, the random access memory 230 may operate as a data buffer memory or a data cache memory.

Figure 16:
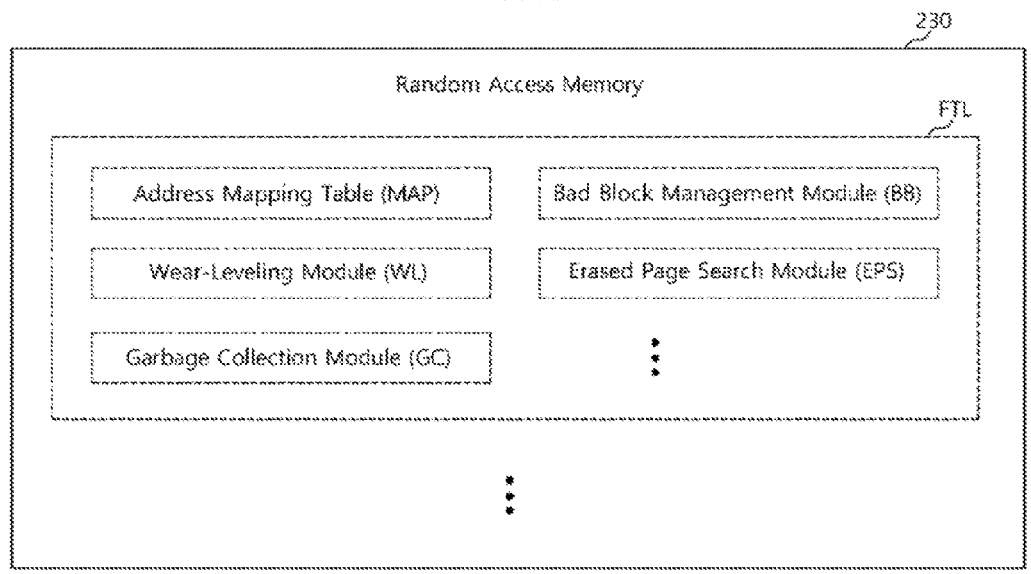
FIG. 16 is a diagram illustrating a firmware or a software to be driven in random access memory.

FIG. 16 is a diagram illustrating the firmware or the software to be driven in the random access memory 230 shown FIG. 15.

In the case where the nonvolatile memory device 100 is configured by a flash memory device, the control unit 210 may control an erase operation by the unit of a memory block, and control a read or program operation by the unit of a page. Further, since it is not possible for the nonvolatile memory device 100 to perform an overwrite operation, the control unit 210 may perform in advance an erase operation in order to store new data in memory cells where data are stored.

The control unit 210 of the data storage device 300, which uses a flash memory device as a data storage medium, may drive a firmware or a software referred to as a flash translation layer (FTL) to control an operation to the flash memory device and provide device compatibility to the host device. Through driving of such FTL, the data storage device 300 may be recognized as a general data storage device such as a hard disk by the host device.

The FTL loaded on the random access memory 230 may be configured by modules for performing various functions and metadata necessary for driving of the modules. For example, when referring to FIG. 16, the FTL may include an address mapping table MAP, a wear-leveling module WL, a garbage collection module GC, a bad block management module BB, and an erased page search module EPS.

In the case where the host device accesses the data storage device 300 (e.g., requests a read operation or a write operation), the host device may provide a logical address to the data storage device 300. The FTL may translate the provided logical address into a physical address of the nonvolatile memory device 100, and perform a requested operation by referring to the converted physical address. In order for such an address translation operation, address translation data (e.g., the address mapping table MAP) may be included in the FTL.

The wear-leveling module WL may manage a degree of wear for memory blocks of the nonvolatile memory device 100. Memory cells of the nonvolatile memory device 100 may be aged by program and erase operations. Aged memory cells or worn-out memory cells may cause fails (e.g., physical defects). The wear-leveling module WL may manage the program-erase counts of respective memory blocks in such a way as to be leveled in order to prevent a certain memory block from being worn out earlier than the other memory blocks.

The garbage collection module GC may manage memory blocks where fragmented data are stored. In the case where the nonvolatile memory device 100 is configured by a flash memory device, as described above, it is not possible for the nonvolatile memory device 100 to perform an overwrite operation, and a unit of erase may be larger than a unit of program. For this reason, the nonvolatile memory device 100 may need an operation of collecting valid data dispersed at physically different positions to one place, when a storage space reaches a limit. The garbage collection module GC may perform an operation of collecting valid data fragmented due to performance of a plurality of write operations and a plurality of erase operations, to a collection area.

The bad block management module BB may manage a memory block in which a fail has occurred among the memory blocks of the nonvolatile memory device 100. As described above, a fail (e.g., a physical defect) may occur in a worn-out memory cell. Data stored in a failed memory cell may not be normally read out. Moreover, data may not be normally stored in a failed memory cell. The bad block management module BB may manage a memory block including a failed memory cell in such a way as to be not used.

The erased page search module EPS may perform an operation for searching an erased page among pages of the nonvolatile memory device 100. The erased page search module EPS may provide the special command for searching an erased page and an address to which the searching operation is to be performed in response to the special command to the nonvolatile memory device 100. For example, the erased page search module EPS may provide the nonvolatile memory device 100 with an address of a page which is suspected to be interrupted during its program operation due to a sudden power-off and the special command for commanding that a state information of program indicator cells corresponding to the address of the page be provided.

Figure 17:
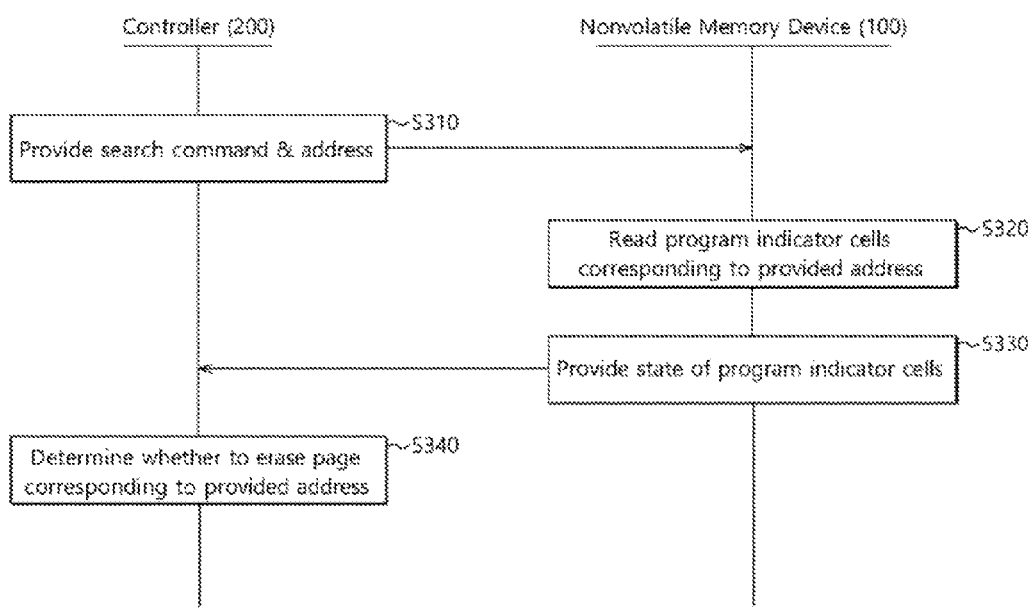
FIG. 17 is a flow chart illustrating operations of a nonvolatile memory device responding to a request from a controller.

FIG. 17 is a flow chart illustrating operations of the nonvolatile memory device 100 responding to a request from a controller. The program indicator cell read operation of the nonvolatile memory device 100 that is performed under the control of the erased page search module EPS of the controller 200 will be described below with reference to FIG. 17.

At step S310, the controller 200 may provide the nonvolatile memory device 100 with the search command for searching an erased page and an address of a page to which the searching operation is to be performed in response to the search command.

At step S320, the nonvolatile memory device 100 may perform the read operation to the program indicator cells corresponding to the provided address, as described with reference to FIG. 14.

At step S330, the nonvolatile memory device 100 may provide the state of the program indicator cells to the controller 200.

At step S340, the controller 200 may determine whether the page corresponding to the provided address is substantially erased or programmed based on the state information of the program indicator cells provided from the nonvolatile memory device 100.

Figure 18:
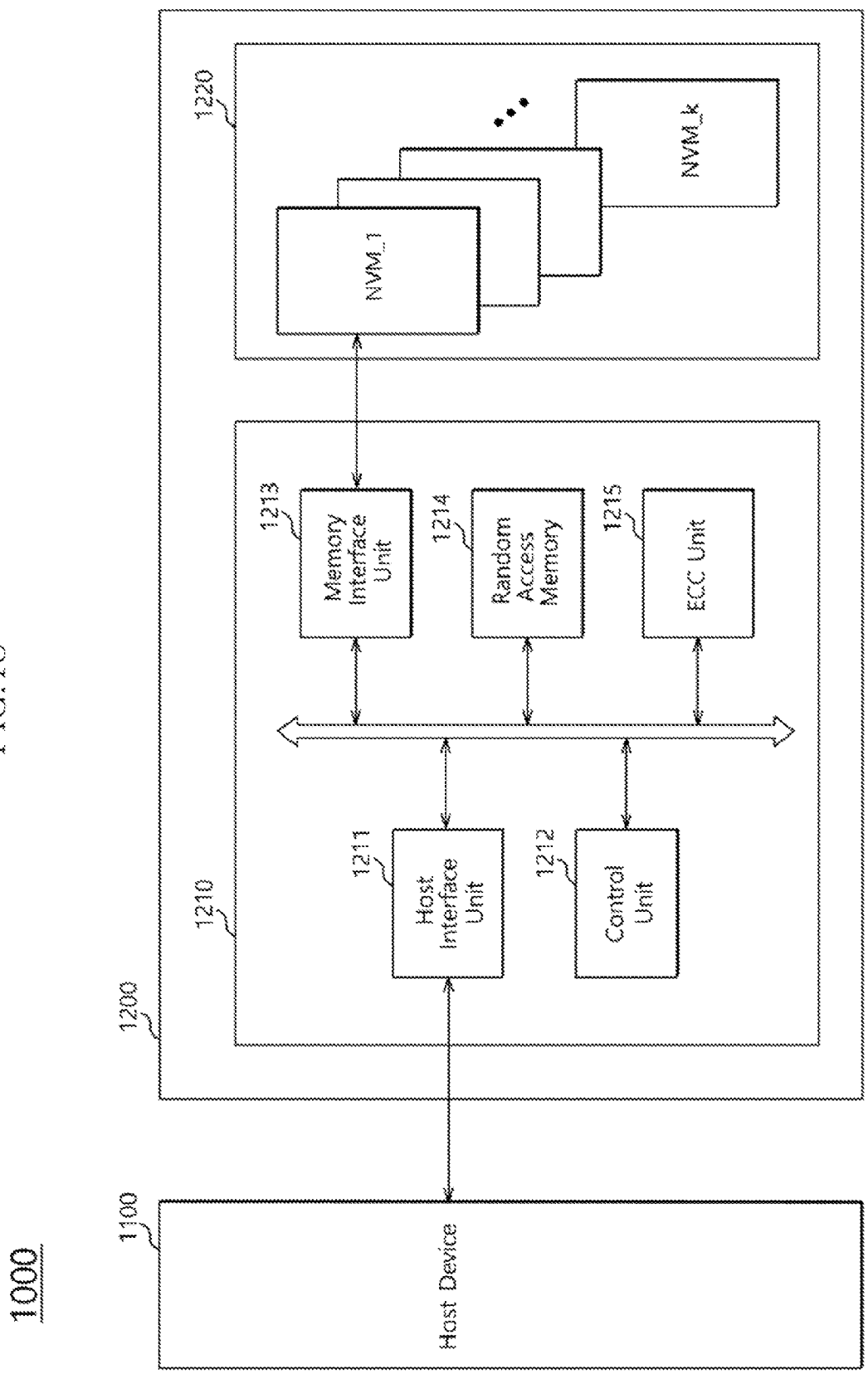
FIG. 18 is a block diagram illustrating a data processing system including a data storage device in accordance with an embodiment.

FIG. 18 is a block diagram illustrating a data processing system including a data storage device in accordance with an embodiment.

A data processing system 1000 may include a host device 1100 and a data storage device 1200. The data storage device 1200 may include a controller 1210 and a nonvolatile memory device 1220. The data storage device 1200 may be used by being coupled to the host device 1100 such as a mobile phone, an MP3 player, a laptop computer, a desktop computer, a game player, a TV, an in-vehicle infotainment system, and so forth.

The controller 1210 may include a host interface unit 1211, a control unit 1212, a memory interface unit 1213, a random access memory 1214, and an error correction code (ECC) unit 1215. The controller 1210 may perform the erased page search operation described above with reference to FIGS. 16 and 17.

The control unit 1212 may control the general operations of the controller 1210 in response to a request from the host device 1100. The control unit 1212 may drive a firmware or a software for controlling the nonvolatile memory device 1220.

The random access memory 1214 may be used as a working memory of the control unit 1212. The random access memory 1214 may be used as a buffer memory which temporarily stores the data read from the nonvolatile memory device 1220 or the data provided from the host device 1100.

The host interface unit 1211 may interface the host device 1100 and the controller 1210. For example, the host interface unit 1211 may communicate with the host device 1100 through one of various interface protocols such as a universal serial bus (USB) protocol, a universal flash storage (UFS) protocol, a multimedia card (MMC) protocol, a peripheral component interconnection (PCI) protocol, a PCI express (PCI-E) protocol, a parallel advanced technology attachment (PATA) protocol, a serial advanced technology attachment (SATA) protocol, a small computer system interface (SCSI) protocol, and a serial attached SCSI (SAS) protocol.

The memory interface unit 1213 may interface the controller 1210 and the nonvolatile memory device 1220. The memory interface unit 1213 may provide commands and addresses to the nonvolatile memory device 1220. Furthermore, the memory interface unit 1213 may exchange data with the nonvolatile memory device 1220.

The error correction code unit 1215 may detect an error of the data read from the nonvolatile memory device 1220. Also, the error correction code unit 1215 may be configured to correct the detected error when the detected error is within a correctable range.

The nonvolatile memory device 1220 may be used as the storage medium of the data storage device 1200. The nonvolatile memory device 1220 may include a plurality of nonvolatile memory chips (or dies) NVM_1 to NVM_k. Each of the nonvolatile memory chips (or dies) NVM_1 to NVM_k may include the program indicator cells described above with reference to FIGS. 1 to 14, and may perform program and read operations for the program indicator cells.

The controller 1210 and the nonvolatile memory device 1220 may be manufactured as any one of various data storage devices. For example, the controller 1210 and the nonvolatile memory device 1220 may be integrated into one semiconductor device and may be manufactured as any one of a multimedia card in the form of an MMC, an eMMC, an RS-MMC and a micro-MMC, a secure digital card in the form of an SD, a mini-SD and an micro-SD, a universal serial bus (USB) storage device, a universal flash storage (UFS) device, a Personal Computer Memory Card International Association (PCMCIA) card, a compact flash (CF) card, a smart media card, a memory stick, and so forth.

Figure 19:
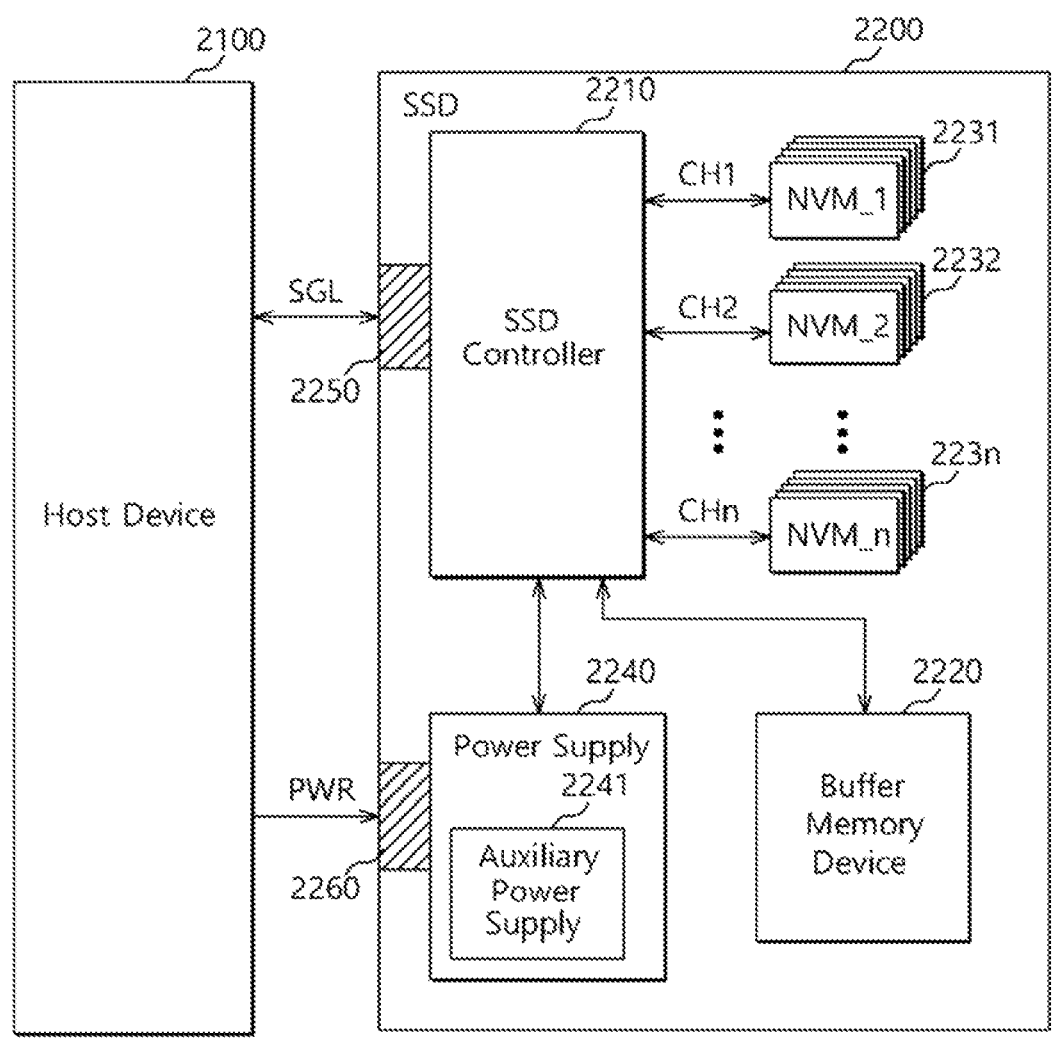
FIG. 19 is a block diagram illustrating a data processing system including a solid state drive (SSD) in accordance with an embodiment.

FIG. 19 is a block diagram illustrating a data processing system including a solid state drive (SSD) in accordance with an embodiment.

A data processing system 2000 may include a host device 2100 and a solid state drive (SSD) 2200.

The SSD 2200 may include an SSD controller 2210, a buffer memory device 2220, nonvolatile memory devices 2231 to 223n, a power supply 2240, a signal connector 2250, and a power connector 2260.

The SSD controller 2210 may access the nonvolatile memory devices 2231 to 223n in response to a request from the host device 2100. The SSD controller 2210 may perform the erased page search operation described above with reference to FIGS. 16 and 17.

The buffer memory device 2220 may temporarily store data which are to be stored in the nonvolatile memory devices 2231 to 223n. Further, the buffer memory device 2220 may temporarily store data which are read from the nonvolatile memory devices 2231 to 223n. The data temporarily stored in the buffer memory device 2220 may be transmitted to the host device 2100 or the nonvolatile memory devices 2231 to 223n under the control of the SSD controller 2210.

The nonvolatile memory devices 2231 to 223n may be used as storage media of the SSD 2200. Each of the nonvolatile memory devices 2231 to 223n may include the program indicator cells described above with reference to FIGS. 1 to 14, and may perform program and read operations for the program indicator cells.

The nonvolatile memory devices 2231 to 223n may be coupled with the SSD controller 2210 through a plurality of channels CH1 to CHn, respectively. One or more nonvolatile memory devices may be coupled to one channel. The nonvolatile memory devices coupled to one channel may be coupled to the same signal bus and data bus.

The power supply 2240 may provide power PWR inputted through the power connector 2260, to the inside of the SSD 2200. The power supply 2240 may include an auxiliary power supply 2241. The auxiliary power supply 2241 may supply power so as to allow the SSD 2200 to be normally terminated when a sudden power-off occurs. The auxiliary power supply 2241 may include super capacitors capable of being charged with power MR.

The SSD controller 2210 may exchange a signal SGL with the host device 2100 through the signal connector 2250. The signal SGL may include a command, an address, data, and so forth. The signal connector 2250 may be configured by a connector such as of parallel advanced technology attachment (PATA), serial advanced technology attachment (SATA), small computer system interface (SCSI), serial attached SCSI (SAS), peripheral component interconnection (PCI) and PCI express (PCI-E) protocols, according to the interface scheme between the host device 2100 and the SSD 2200.

Figure 20:
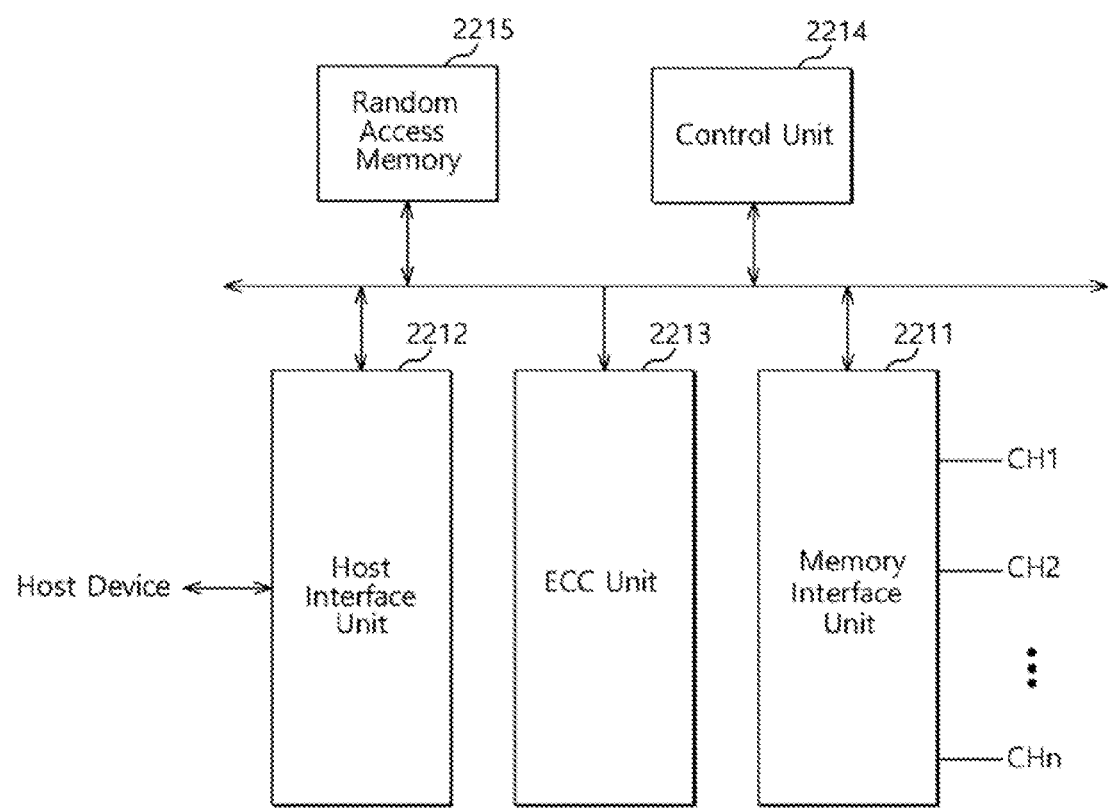
FIG. 20 is a block diagram illustrating an SSD controller.

FIG. 20 is a block diagram illustrating the SSD controller shown in FIG. 19. Referring to FIG. 19, the SSD controller 2210 may include a memory interface unit 2211, a host interface unit 2212, an error correction code (ECC) unit 2213, a control unit 2214, and a random access memory 2215.

The memory interface unit 2211 may provide a control signal such as a command and an address to the nonvolatile memory devices 2231 to 223n. Moreover, the memory interface unit 2211 may exchange data with the nonvolatile memory devices 2231 to 223n. The memory interface unit 2211 may scatter the data transmitted from the buffer memory device 2220 to the respective channels CH1 to CHn under the control of the control unit 2214. Furthermore the memory interface unit 2211 may transmit the data read from the nonvolatile memory devices 2231 to 223n to the buffer memory device 2220 under the control of the control unit 2214.

The host interface unit 2212 may provide an interface with the SSD 2200 in correspondence to the protocol of the host device 2100. For example, the host interface unit 2212 may communicate with the host device 2100 through one of parallel advanced technology attachment (PATA), serial advanced technology attachment (SATA), small computer system interface (SCSI), serial attached SCSI (SAS), peripheral component interconnection (PCI) and PCI express (PCI-E) protocols. In addition, the host interface unit 2212 may perform a disk emulating function of supporting the host device 2100 to recognize the SSD 2200 as a hard disk drive (HDD).

The ECC unit 2213 may generate parity bits based on the data transmitted to the nonvolatile memory devices 2231 to 223n. The generated parity bits may be stored along with data in the nonvolatile memory devices 2231 to 223n. The ECC unit 2213 may detect an error of the data read from the nonvolatile memory devices 2231 to 223n. When the detected error is within a correctable range, the ECC unit 2213 may correct the detected error.

The control unit 2214 may analyze and process the signal SGL inputted from the host device 2100. The control unit 2214 may control the operations of the buffer memory device 2220 and the nonvolatile memory devices 2231 to 223n according to a firmware or a software for driving the SSD 2200.

The random access memory 2215 may be used as a working memory for driving the firmware or the software.

Figure 21:
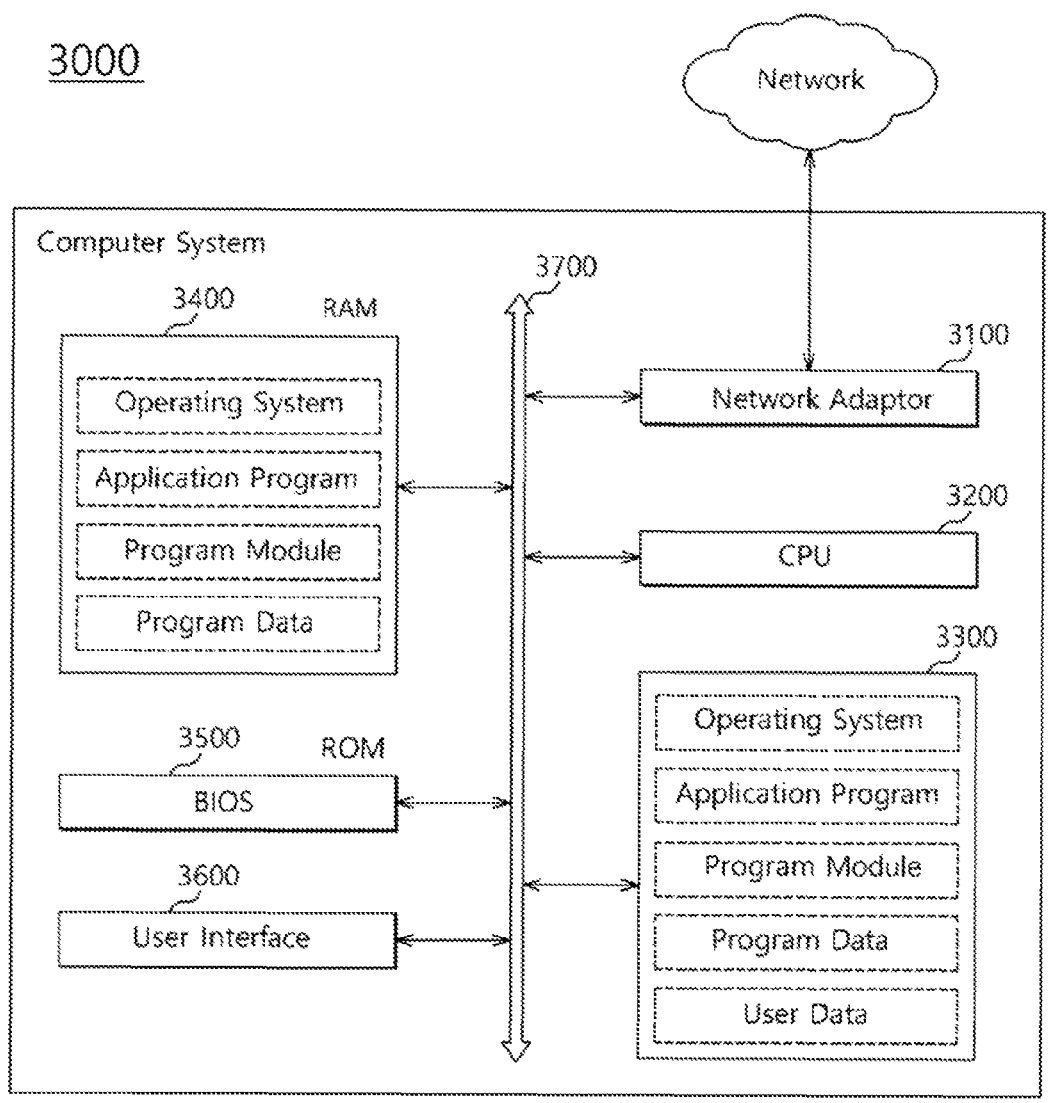
FIG. 21 is a block diagram illustrating a computer system having mounted therein a data storage device in accordance with an embodiment.

FIG. 21 is a block diagram illustrating a computer system having mounted therein a data storage device in accordance with an embodiment. Referring to FIG. 21, a computer system 3000 includes a network adaptor 3100, a central processing unit 3200, a data storage device 3300, a RAM 3400, a ROM 3500 and a user interface 3600, which are electrically coupled to a system bus 3700. The data storage device 3300 may be constructed by the data storage device 300 shown in FIG. 15, the data storage device 1200 shown in FIG. 18 or the SSD 2200 shown in FIG. 19.

The network adaptor 3100 may provide interfacing between the computer system 3000 and external networks. The central processing unit 3200 performs general operations for driving an operating system residing at the RAM 3400 or an application program.

The data storage device 3300 may store general data necessary in the computer system 3000. For example, an operating system for driving the computer system 3000, an application program, various program modules, program data and user data may be stored in the data storage device 3300.

The RAM 3400 may be used as the working memory of the computer system 3000. Upon booting, the operating system, the application program, the various program modules and the program data necessary for driving programs, which are read from the data storage device 3300, may be loaded on the RAM 3400. A BIOS (basic input/output system) which is activated before the operating system is driven may be stored in the ROM 3500. Information exchange between the computer system 3000 and a user may be implemented through the user interface 3600.

While various embodiments have been described above, it will be understood to those skilled in the art that the embodiments described are examples only. Accordingly, the nonvolatile memory device, the data storage device including the same, and the operating method thereof described herein should not be limited based on the described embodiments.

What is claimed is:

1. A data storage device comprising:
a nonvolatile memory device including:
memory cells of a first area grouped by page, and
memory cells of a second area respectively corresponding to pages, and suitable for storing information representing whether each page of the first area is in an erased state; and
a controller suitable for providing the nonvolatile memory device with a search command for searching an erased page and a search address of a page,
wherein the nonvolatile memory device, in response to the search command, performs a read operation only on the memory cells of the second area corresponding to the search address, and provides the controller with a result of the read operation.

2. The data storage device according to claim 1,
wherein the controller provides the nonvolatile memory device with a program command and a program address of a page, and
wherein the nonvolatile memory device performs a program operation to the first area corresponding to the program address after a program operation to the second area corresponding to the program address is performed.

3. The data storage device according to claim 2, wherein the nonvolatile memory device applies a program voltage only once to the second area corresponding to the program address during the program operation to the second area.

4. The data storage device according to claim 3, wherein the nonvolatile memory device performs the program operation to the second area without a program verification to the second area corresponding to the program address.

5. The data storage device according to claim 2, wherein the nonvolatile memory device applies a plurality of program voltages to the first area corresponding to the program address during the program operation to the first area.

6. The data storage device according to claim 5, wherein the nonvolatile memory device performs a program verification to the first area corresponding to the program address each time each of the program voltages is applied during the program operation to the first area.

7. A method for operating a data storage device including a nonvolatile memory device including: memory cells of a first area; and memory cells of a second area respectively corresponding to the memory cells of the first area, and each of which stores information representing whether a program voltage is applied to a corresponding memory cell of the first area, the method comprising:
performing a program operation, when a program command and a program address of a first memory cell of the first area are provided, to a first memory cell of the second area corresponding to the program address;
performing a program operation to the first memory cell of the first area;
performing a read operation, when a search command and a search address of a second memory cell of the first area are provided, only on a second memory cell of the second area corresponding to the search address; and
determining whether a program voltage is applied to the second memory cell of the first area based on a result of the read operation.

8. The method according to claim 7, wherein the performing of the program operation to the first memory cell of the second area includes applying a program voltage to the first memory cell of the second area once without a program verification.

9. A nonvolatile memory device comprising:
a memory cell of a first area suitable for storing data; and
a memory cell of a second area suitable for storing information representing whether a program voltage is applied to the memory cell of the first area,
wherein the memory cell of the first area comprises a multi-level cell which stores two or more-bit data, and
wherein the nonvolatile memory device further comprises a memory cell of a third area suitable for storing information representing whether upper bit data is programmed in the memory cell of the first area.

10. The nonvolatile memory device according to claim 9, further comprising a control logic suitable for perform a program operation to the memory cell of the second area and then a program operation to the memory cell of the first area.

11. The nonvolatile memory device according to claim 10, wherein the control logic applies a program voltage to the memory cell of the second area once during the program operation to the memory cell of the second area.

12. The nonvolatile memory device according to claim 10, wherein the control logic performs the program operation to the memory cell of the second area without a program verification.

13. The nonvolatile memory device according to claim 9, wherein the memory cell of the first area and the memory cell of the second area are coupled to the same word line.

* * * * *